US012783179B2

(12) United States Patent
Sohn et al.

(10) Patent No.: US 12,783,179 B2
(45) Date of Patent: Nov. 3, 2026

(54) MEMORY DEVICE FOR IMPROVING EFFICIENCY OF COMMAND INPUT OPERATION

(71) Applicant: SK hynix Inc., Gyeonggi-do (KR)

(72) Inventors: Hyeok Chan Sohn, Gyeonggi-do (KR); Byung Ryul Kim, Gyeonggi-do (KR); Yong Soon Park, Gyeonggi-do (KR); Kang Wook Jo, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 356 days.

(21) Appl. No.: 18/295,852

(22) Filed: Apr. 5, 2023

(65) Prior Publication Data

US 2024/0168634 A1 May 23, 2024

(30) Foreign Application Priority Data

Nov. 22, 2022 (KR) ........................ 10-2022-0157280

(51) Int. Cl.

| | |
|---|---|
| ***G06F 3/06*** | (2006.01) |
| ***G11C 7/10*** | (2006.01) |
| ***G11C 7/22*** | (2006.01) |
| ***G11C 8/10*** | (2006.01) |

(52) U.S. Cl.
CPC .......... *G06F 3/0679* (2013.01); *G11C 7/1045* (2013.01); *G11C 7/22* (2013.01); *G11C 8/10* (2013.01)

(58) Field of Classification Search
CPC ...... G06F 3/0679; G06F 3/061; G06F 3/0659; G06F 3/0658; G11C 7/1045; G11C 7/22; G11C 8/10; G11C 7/109; G11C 16/0483; G11C 16/14
See application file for complete search history.

(56) References Cited

U.S. PATENT DOCUMENTS

| | | | | |
|---|---|---|---|---|
| 8,996,759 | B2 | 3/2015 | Chung | |
| 9,042,195 | B2 | 5/2015 | Ito et al. | |
| 2021/0173773 | A1* | 6/2021 | Pearson | G06F 12/0646 |
| 2022/0020401 | A1* | 1/2022 | Fujioka | G11C 7/1045 |
| 2023/0395108 | A1* | 12/2023 | Bhatia | G11C 7/1063 |

* cited by examiner

*Primary Examiner* — Donald HB Braswell
(74) *Attorney, Agent, or Firm* — IP&T GROUP LLP

(57) ABSTRACT

A memory device comprises a command decoding unit configured to generate a command by decoding an input signal applied to a first pad, wherein whether the command decoding unit is to be disabled is selected based on whether an operating state signal is activated, an operating state control unit configured to activate or deactivate the operating state signal in response to a set signal applied to the first pad, and an internal operation execution unit configured to perform a set internal operation in response to the command.

19 Claims, 10 Drawing Sheets

MEMORY DEVICE FOR IMPROVING EFFICIENCY OF COMMAND INPUT OPERATION

CROSS-REFERENCE TO RELATED APPLICATION

This application claims priority under 35 U.S.C. § 119 to Korean Patent Application No. 10-2022-0157280 filed on Nov. 22, 2022, which is incorporated herein by reference in its entirety.

BACKGROUND

1. Field

Various embodiments of the present disclosure relate to an electronic device, and particularly, to a memory device for improving efficiency of a command input operation.

2. Discussion of the Related Art

Memory systems are storage devices embodied using a semiconductor such as silicon (Si), germanium (Ge), gallium arsenide (GaAs), indium phosphide (InP), or the like. The memory systems are classified into a volatile memory device and a nonvolatile memory device. The volatile memory device is a memory device in which data stored therein is lost when power supply is interrupted. Representative examples of the volatile memory device include static RAM (SRAM), dynamic RAM (DRAM), synchronous DRAM (SDRAM), etc. The nonvolatile memory device is a memory device in which data stored therein is retained even when power supply is interrupted. Representative examples of the nonvolatile memory device include a read only memory (ROM), a programmable ROM (PROM), an electrically programmable ROM (EPROM), an electrically erasable programmable ROM (EEPROM), a flash memory, a phase-change random access memory (PRAM), a magnetic RAM (MRAM), a resistive RAM (RRAM), a ferroelectric RAM (FRAM), etc.

A nonvolatile memory device may include memory cells, and may perform a program operation of storing data in the memory cells, a read operation of outputting data stored in the memory cells, and an erase operation of erasing data stored in the memory cells.

A memory device that is included in a storage device may have a form including multiple memory dies. In this case, the multiple memory dies may have a form in which the multiple memory dies share a channel for transferring data, addresses, and commands.

In such a case, when any of the multiple memory dies uses the channel, the remaining memory dies cannot use the channel. Accordingly, a conventional technology can minimize the time during which each of the multiple memory dies possesses the channel exclusively by sequentially operating the multiple memory dies through an interleaving method.

However, although the interleaving method is used, in order for an operation of continuously transferring two different command signals to two different memory dies that share the channel to be performed normally, an interval having the smallest amount of time which is guaranteed in specifications between the two command signals that are continuously transmitted through the channel needs to be maintained. That is, a second command needs to be transferred to a second memory die after a lapse of the smallest amount of time from timing at which a first command is transferred to a first memory die through the channel.

SUMMARY

Various embodiments of the present disclosure are directed to providing a memory device capable of ignoring a command that is input from the outside by entering a freeze mode.

Various embodiments of the present disclosure are directed to providing a memory device capable of ignoring a command that is applied through a channel by selectively making each of multiple memory dies enter the freeze mode in a memory device including the multiple memory dies that share the channel.

Technical objects to be achieved by the present disclosure are not limited to the aforementioned objects, and the other objects not described above may be understood from the following description by a person having ordinary knowledge in the art to which the present disclosure pertains.

In an embodiment of the present disclosure, a memory device may include: a command decoding unit configured to generate a command by decoding an input signal applied to a first pad, wherein whether the command decoding unit is to be disabled is selected based on whether an operating state signal is activated; an operating state control unit configured to activate or deactivate the operating state signal in response to a set signal applied to the first pad; and an internal operation execution unit configured to perform a set internal operation in response to the command.

In an embodiment of the present disclosure, a memory device may include: a first die including a first pad connected to a first line and configured to: block, during a first set mode, signals except a first set signal for controlling the first die to exit from the first set mode, and perform, during a mode other than the first set mode, a first set internal operation in response to an input signal applied to the first pad; and a second die including a second pad connected to the first line and configured to: block, during the second set mode, signals except a second set signal for controlling the second die to exit from the second set mode, and perform, during a mode other than the second set mode, a second set internal operation in response to an input signal applied to the second pad.

In an embodiment of the present disclosure, a device may include: first and second operating apparatuses commonly coupled to a line, through which commands are provided, wherein the first operating apparatus is configured to: enter a blocking mode in response to a first entering command, block, during the blocking mode, commands other than a first exit command, and exit the blocking mode in response to the first exit command, wherein the second operating apparatus is configured to: enter the blocking mode in response to a second entering command, block, during the blocking mode, commands other than a second exit command, and exit the blocking mode in response to the second exit command, and wherein each of the first and second operating apparatuses is further configured to perform an operation in response to a non-blocked command.

In an embodiment of the present disclosure, a device may include: an operating apparatus coupled to a line, through which commands are provided, wherein the operating apparatus is configured to: enter a blocking mode in response to a first entering command, block, during the blocking mode, commands other than a first exit command, and exit the blocking mode in response to the first exit command, and wherein the operating apparatus is further configured to perform an operation in response to a non-blocked command.

According to this technology, a command that is input from the outside can be ignored by making a memory device enter the freeze mode. Accordingly, the command can be prevented from being unnecessarily input to the memory device.

Furthermore, according to this technology, a command that is applied through a channel can be ignored by selectively making each of multiple memory dies enter the freeze mode in a memory device including the multiple memory dies that share the channel. Accordingly, a command that needs to be input to a memory die that has not entered the freeze mode can be prevented from being input to a memory die that has entered the freeze mode.

DETAILED DESCRIPTION

Figure 1:
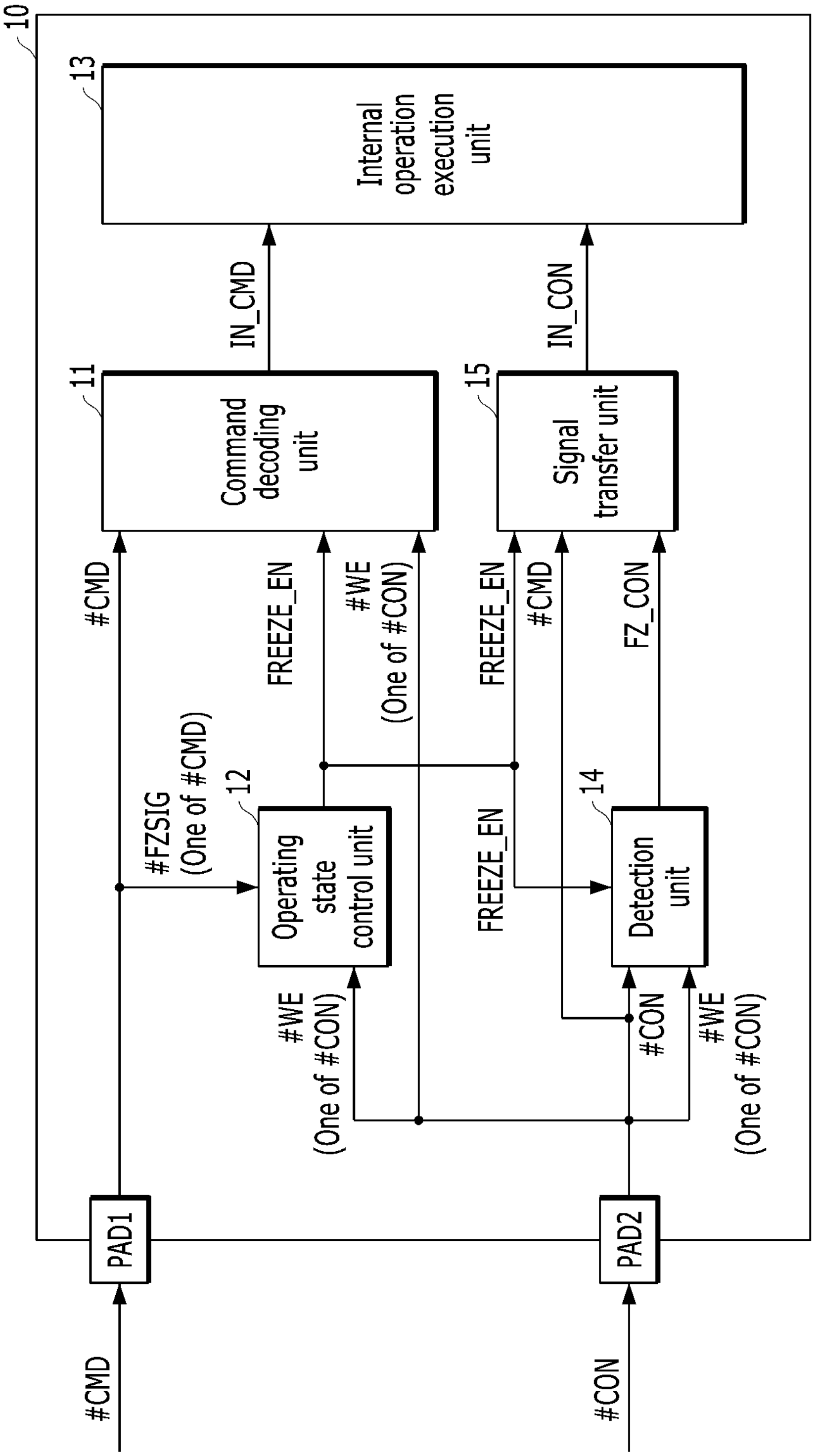
FIG. 1 is a diagram for describing an example of a memory device according to a first embodiment of the present disclosure.

Various embodiments of the present disclosure are described below with reference to the accompanying drawings. Elements and features of this disclosure, however, may be configured or arranged differently to form other embodiments, which may be variations of any of the disclosed embodiments.

In this disclosure, references to various features (e.g., elements, structures, modules, components, steps, operations, characteristics, etc.) included in "one embodiment," "example embodiment," "an embodiment," "another embodiment," "some embodiments," "various embodiments," "other embodiments," "alternative embodiment," and the like are intended to mean that any such features are included in one or more embodiments of the present disclosure, but may or may not necessarily be combined in the same embodiments.

In this disclosure, the terms "comprise," "comprising," "include," and "including" are open-ended. As used in the appended claims, these terms specify the presence of the stated elements and do not preclude the presence or addition of one or more other elements. The terms in a claim do not foreclose the apparatus from including additional components (e.g., an interface unit, circuitry, etc.).

In this disclosure, various units, circuits, or other components may be described or claimed as "configured to" perform a task or tasks. In such contexts, "configured to" is used to connote structure by indicating that the blocks/units/circuits/components include structure (e.g., circuitry) that performs one or more tasks during operation. As such, the block/unit/circuit/component can be said to be configured to perform the task even when the specified block/unit/circuit/component is not currently operational (e.g., is not turned on nor activated). The block/unit/circuit/component used with the "configured to" language includes hardware, for example, circuits, memory storing program instructions executable to implement the operation, etc. Additionally, "configured to" can include a generic structure (e.g., generic circuitry) that is manipulated by software and/or firmware (e.g., an FPGA or a general-purpose processor executing software) to operate in a manner that is capable of performing the task(s) at issue. "Configured to" may also include adapting a manufacturing process (e.g., a semiconductor fabrication facility) to fabricate devices (e.g., integrated circuits) that implement or perform one or more tasks.

As used in this disclosure, the term 'circuitry' or 'logic' refers to all of the following: (a) hardware-only circuit implementations (such as implementations in only analog and/or digital circuitry) and (b) combinations of circuits and software (and/or firmware), such as (as applicable): (i) to a combination of processor(s) or (ii) to portions of processor(s)/software (including digital signal processor(s)), software, and memory(ies) that work together to cause an apparatus, such as a mobile phone or server, to perform various functions and (c) circuits, such as a microprocessor(s) or a portion of a microprocessor(s), that require software or firmware for operation, even if the software or firmware is not physically present. This definition of 'circuitry' or 'logic' applies to all uses of this term in this application, including in any claims. As a further example, as used in this application, the term "circuitry" or "logic" also covers an implementation of merely a processor (or multiple processors) or a portion of a processor and its (or their) accompanying software and/or firmware. The term "circuitry" or "logic" also covers, for example, and if applicable to a particular claim element, an integrated circuit for a storage device.

As used herein, the terms "first," "second," "third," and so on are used as labels for nouns that the terms precede, and do not imply any type of ordering (e.g., spatial, temporal, logical, etc.). The terms "first" and "second" do not necessarily imply that the first value must be written before the second value. Further, although the terms may be used herein to identify various elements, these elements are not limited by these terms. These terms are used to distinguish one element from another element that otherwise have the same or similar names. For example, a first circuitry may be distinguished from a second circuitry.

Further, the term "based on" is used to describe one or more factors that affect a determination. This term does not foreclose additional factors that may affect a determination. That is, a determination may be solely based on those factors or based, at least in part, on those factors. For example, the phrase "determine A based on B." While in this case, B is a factor that affects the determination of A, such a phrase does not foreclose the determination of A from also being based on C. In other instances, A may be determined based solely on B.

Herein, an item of data, a data item, a data entry or an entry of data may be a sequence of bits. For example, the data item may include the contents of a file, a portion of the file, a page in memory, an object in an object-oriented program, a digital message, a digital scanned image, a part of a video or audio signal, metadata or any other entity which can be represented by a sequence of bits. According to an embodiment, the data item may include a discrete object. According to another embodiment, the data item may include a unit of information within a transmission packet between two different components.

First Embodiment

FIG. 1 is a diagram for describing an example of a memory device according to a first embodiment of the present disclosure.

Referring to FIG. 1, a memory device 10 according to a first embodiment of the present disclosure may include a command decoding unit 11, an operating state control unit 12, an internal operation execution unit 13, a detection unit 14, and a signal transfer unit 15.

In this case, the command decoding unit 11 may be enabled while an operating state signal FREEZE_EN stays deactivated, and may generate an internal command IN_CMD by decoding an input signal #CMD applied to a first pad PAD1. The command decoding unit 11 may be disabled while the operating state signal FREEZE_EN stays activated.

The command decoding unit 11 may receive the input signal #CMD applied to the first pad PAD1 in response to an input reference signal #WE among input signals #CON applied to a second pad PAD2, in the state in which the command decoding unit 11 has been enabled. In an embodiment, the command decoding unit 11 may receive the input signal #CMD applied to the first pad PAD1, in response to a rising edge of the input reference signal #WE applied to the second pad PAD2.

The operating state control unit 12 may deactivate the operating state signal FREEZE_EN that stays activated or may activate the operating state signal FREEZE_EN that stays deactivated, in response to a freeze signal #FZSIG of the input signals #CMD applied to the first pad PAD1. In an embodiment, the operating state control unit 12 may switch the operating state signal FREEZE_EN from a deactivation state to an activation state by switching the operating state signal FREEZE_EN from a logic low level to a logic high level, in response to the freeze signal #FZSIG of the input signals #CMD applied to the first pad PAD1. In an embodiment, the operating state control unit 12 may switch the operating state signal FREEZE_EN from the activation state to the deactivation state by switching the operating state signal FREEZE_EN from a logic high level to a logic low level, in response to the freeze signal #FZSIG of the input signals #CMD applied to the first pad PAD1.

In this case, the interval in which the operating state signal FREEZE_EN stays activated may be defined as an entry interval of a freeze mode. That is, the entry interval of the freeze mode may be an interval in which the command decoding unit 11 is disabled and does not perform any operation. In contrast, the interval in which the operating state signal FREEZE_EN stays deactivated may be defined as an exit interval of the freeze mode. That is, the exit interval of the freeze mode may be an interval in which the command decoding unit 11 is enabled and performs a normal operation, that is, generates the internal command IN_CMD.

The operating state control unit 12 may ignore the remaining signals except the freeze signal #FZSIG among the input signals #CMD applied to the first pad PAD1, when the remaining signals are applied. That is, the operating state control unit 12 may not perform any operation in response to the remaining signals except the freeze signal #FZSIG among the input signals #CMD applied to the first pad PAD1.

The command decoding unit 11 may ignore the freeze signal #FZSIG among the input signals #CMD applied to the first pad PAD1, when the freeze signal #FZSIG is applied. That is, the command decoding unit 11 may not perform any operation in response to the freeze signal #FZSIG among the input signals #CMD applied to the first pad PAD1.

The operating state control unit 12 may receive the freeze signal #FZSIG applied to the first pad PAD1, in response to the input reference signal #WE among the input signals #CON applied to the second pad PAD2. In an embodiment, the operating state control unit 12 may receive the freeze signal #FZSIG applied to the first pad PAD1, in response to a rising edge of the input reference signal #WE applied to the second pad PAD2.

The internal operation execution unit 13 may perform a set internal operation in response to the internal command IN_CMD that is generated by the command decoding unit 11.

The detection unit 14 may detect the logic level of the input signal #CON applied to the second pad PAD2, at a time point when the operating state signal FREEZE_EN becomes activated.

The signal transfer unit 15 may transfer, to the internal operation execution unit 13, the input signal #CON applied to the second pad PAD2 while the operating state signal FREEZE_EN stays deactivated. The signal transfer unit 15 may transfer, to the internal operation execution unit 13 while the operating state signal FREEZE_EN stays activated, a signal FZ_CON having the logic level detected by the detection unit 14.

More specifically, the internal operation execution unit 13 may include a memory cell array (not illustrated). In an embodiment, the memory cell array that is included in the internal operation execution unit 13 may include a volatile memory cell. In an embodiment, the memory cell array that is included in the internal operation execution unit 13 may include a nonvolatile memory cell. In an embodiment, the internal operation execution unit 13 may perform a write (or program) operation of storing data in the memory cell array within the internal operation execution unit 13, in response to the internal command IN_CMD that is generated by the command decoding unit 11. In an embodiment, the internal operation execution unit 13 may perform a read operation of reading data stored in the memory cell array within the internal operation execution unit 13, in response to the internal command IN_CMD that is generated by the command decoding unit 11. In an embodiment, the internal operation execution unit 13 may perform an erase operation of erasing data stored in the memory cell array within the internal operation execution unit 13, in response to the internal command IN_CMD that is generated by the command decoding unit 11.

When the input signal #CMD applied to the first pad PAD1 is the freeze signal #FZSIG, the memory device 10 according to the first embodiment of the present disclosure may enter the freeze mode, and may ignore all input signals #CMD applied to the first pad PAD1 in the entry interval of the freeze mode by disabling an operation of the command decoding unit 11. That is, the memory device 10 according to the first embodiment of the present disclosure can block the input signal #CMD applied to the first pad PAD1 in the entry interval of the freeze mode.

Furthermore, the memory device 10 according to the first embodiment of the present disclosure may transfer, to the internal operation execution unit 13 in the entry interval of the freeze mode, all input signals #CON input to the second pad PAD2 by fixing the logic levels of the input signals #CON to a logic level that is detected at a time point of entering the freeze mode. That is, the memory device 10 according to the first embodiment of the present disclosure can block the input signal #CMD applied to the second pad PAD2 in the entry interval of the freeze mode.

Figure 2:
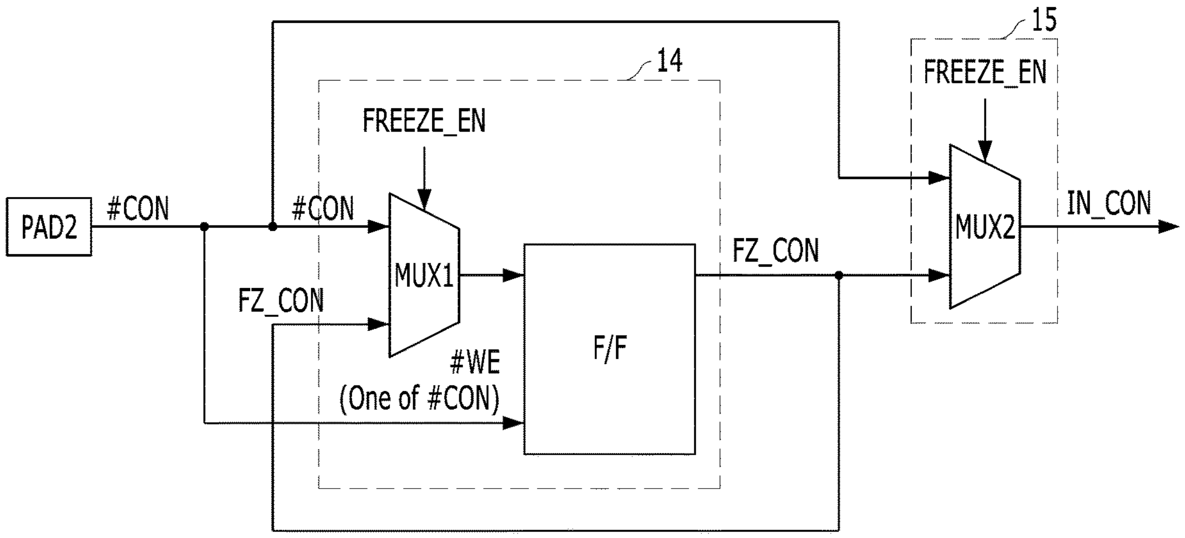
FIG. 2 is a diagram for describing an example of a detection unit and a signal transfer unit among components of the memory device according to the first embodiment of the present disclosure, which is illustrated in FIG. 1.

FIG. 2 is a diagram for describing an example of the detection unit and the signal transfer unit among the components of the memory device according to the first embodiment of the present disclosure, which is illustrated in FIG. 1.

Referring to FIG. 2, the detection unit 14 may include a first multiplexer MUX1 and a flip-flop F/F. Furthermore, the signal transfer unit 15 may include a second multiplexer MUX2.

In this case, the first multiplexer MUX1 that is included in the detection unit 14 may select and output one of the input signal #CON and the detection signal FZ_CON applied to the second pad PAD2, in response to the operating state signal FREEZE_EN.

In an embodiment, the first multiplexer MUX1 may select and output the detection signal FZ_CON in the entry interval of the freeze mode while the operating state signal FREEZE_EN stays activated, and may select and output the input signal #CON applied to the second pad PAD2 in the exit interval of the freeze mode in which the operating state signal FREEZE_EN stays deactivated.

Furthermore, the flip-flop F/F that is included in the detection unit 14 may output a signal from the first multiplexer MUX1, as the detection signal FZ_CON, in response to the input reference signal #WE among the input signals #CON applied to the second pad PAD2.

Specifically, the flip-flop F/F may detect the input signal #CON applied to the second pad PAD2 each time the input reference signal #WE is applied, in the exit interval of the freeze mode in which the operating state signal FREEZE_EN stays deactivated, and may output, as the detection signal FZ_CON, the detected input signal #CON. Furthermore, the operating state control unit 12 described with reference to FIG. 1 may switch the operating state signal FREEZE_EN from a deactivation state to an activation state or from the activation state to the deactivation state in response to the input reference signal #WE among the input signals #CON. In this case, both the operating state control unit 12 and the flip-flop F/F operate in response to the input reference signal #WE applied to the second pad PAD2, and may require a certain time until the operating state control unit 12 performs an operation of switching the operating state signal FREEZE_EN from the deactivation state to the activation state. Accordingly, at a time point when the operating state signal FREEZE_EN switches from the deactivation state to the activation state, the logic level of the detection signal FZ_CON from the flip-flop F/F may be the logic level of a signal from the first multiplexer MUX1, that is, the input signal #CON applied to the second pad PAD2, before the operating state control unit 12 switches the operating state signal FREEZE_EN from the deactivation state to the activation state.

Furthermore, the second multiplexer MUX2 that is included in the signal transfer unit 15 may transfer, to the internal operation execution unit 13, one of the input signal #CON and the detection signal FZ_CON applied to the second pad PAD2.

In an embodiment, the second multiplexer MUX2 may select and output the detection signal FZ_CON from the flip-flop F/F in the entry interval of the freeze mode in which the operating state signal FREEZE_EN stays activated, may select the input signal #CON applied to the second pad PAD2 in the exit interval of the freeze mode in which the operating state signal FREEZE_EN stays deactivated, and may output the input signal #CON to the internal operation execution unit 13.

Figure 3:
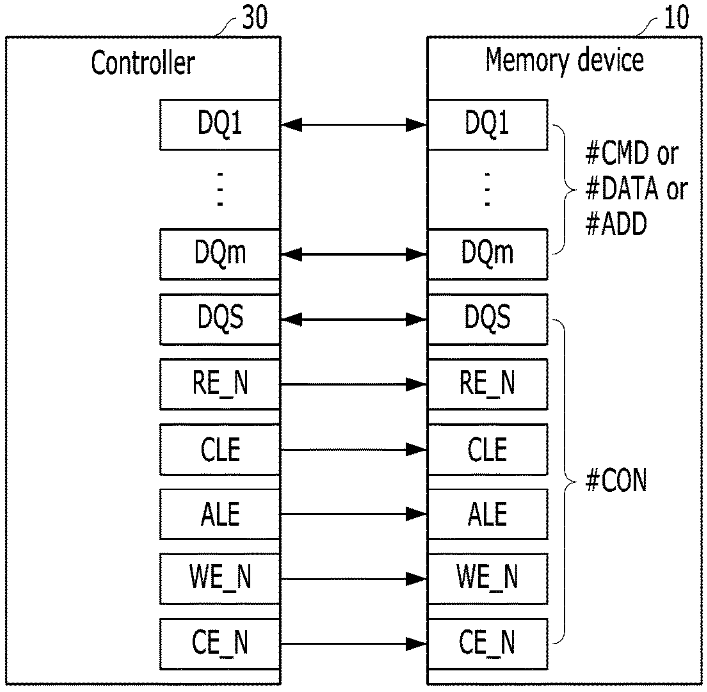
FIG. 3 is a diagram for describing an example of a memory system that includes the memory device according to the first embodiment of the present disclosure, which is illustrated in FIG. 1.

FIG. 3 is a diagram for describing an example of a memory system that includes the memory device according to the first embodiment of the present disclosure, which is illustrated in FIG. 1.

Referring to FIG. 3, the memory system may include the memory device 10 and a controller 30. The memory device 10 and the controller 30 within the memory system may be components that are physically different from each other. In an embodiment, the memory device 10 and the controller 30 may be components that are functionally different from each other. In an embodiment, the memory device 10 and the controller 30 may be implemented through one semiconductor device chip or multiple semiconductor device chips.

In an embodiment, the memory system may be implemented as one of various types of storage devices, such as a solid state drive (SSD), a multi-media card (MMC) having an MMC, embedded MMC (eMMC), reduced size MMC (RS-MMC), or micro-MMC form, a secure digital (SD) card having an SD, mini-SD, or micro-SD form, a universal serial bus (USB) storage device, a universal flash storage (UFS) device, a compact flash (CF) card, a smart media card, and a memory stick.

The memory device 10 may store data. The memory device 10 may operate in response to control of the controller 30. The memory device 10 may include a memory cell array (not illustrated) which includes multiple memory cells in which data is stored.

In an embodiment, the memory device 10 may be implemented as a memory device, such as read only memory (ROM), mask ROM (MROM), programmable ROM (PROM), erasable PROM (EPROM), electrically erasable PROM (EEPROM), ferromagnetic ROM (FROM), phase change RAM (PRAM), magnetic RAM (MRAM), resistive RAM (RRAM), NAND or NOR flash memory, phase change random access memory (PCRAM), resistive memory (RRAM or ReRAM), ferroelectrics RAM (FRAM), or spin transfer torque magnetic RAM (STT-RAM or STT-MRAM). In the present disclosure, it is described that the memory device 10 is NAND flash memory.

The memory cell array (not illustrated) that is included in the memory device 10 may include multiple memory blocks. Each of the memory blocks may include multiple memory cells. One memory block may include multiple pages. In an embodiment, the page may be a unit by which data is written (or programmed) in the memory device 10 or by which data stored in the memory device 10 is read. The memory block may be a unit by which data is erased.

The memory device 10 may be configured to receive a command and an address from the controller 30 and to access a region selected by the address within the memory cell array. The memory device 10 may perform, on the region selected by the address, an operation that is indicated by the command. For example, the memory device 10 may perform a write operation (or a program operation), a read operation, and an erase operation. After the start of the program operation, the memory device 10 will write data in the region selected by the address. After the start of the read operation, the memory device 10 will read data from the region selected by the address. After the start of the erase operation, the memory device 10 will erase data stored in the region selected by the address.

The controller 30 may control an overall operation of the memory device 10.

The controller 30 may control the memory device 10 to perform a program operation, a read operation, or an erase operation in response to a request from a host. After the start of the program operation, the controller 30 may provide a write command, an address, and data to the memory device 10. After the start of the read operation, the controller 30 may provide a read command and an address to the memory device 10. After the start of the erase operation, the controller 30 may provide an erase command and an address to the memory device 10.

In an embodiment, the controller 30 may autonomously generate a command, an address, and data regardless of a request from a host, and may transmit the command, the address, and the data to the memory device 10. For example, the controller 30 may provide the memory device 10 with a command, an address, and data for performing a read operation and a program operation, which are involved in performing wear leveling, a read reclaim, and garbage collection.

The controller 30 and the memory device 10 may exchange data #DATA, commands #CMD, and addresses #ADD through a common channel. Each of the controller 30 and the memory device 10 may include first to m-th input and output (I/O) pads DQ1 to DQm. The controller 30 and the memory device 10 may exchange the data #DATA, the commands #CMD, and the addresses #ADD through the first to m-th I/O pads DQ1 to DQm. In an embodiment, a signal which may be transmitted through the first to m-th I/O pads DQ1 to DQm in response to a form of a control signal #CON may be identified as one of the data #DATA, the command #CMD, or the address #ADD. In an embodiment, m may be a natural number equal to or greater than 2.

In particular, referring to FIG. 1 along with FIG. 3, all first to m-th I/O pads DQ1 to DQm disclosed in FIG. 3 may mean the first pad PAD1 disclosed in FIG. 1. In an embodiment, the operating state control unit 12 and the command decoding unit 11 disclosed in FIG. 1 may receive, as one input signal #CMD, an m-bit signal applied to the first to m-th I/O pads DQ1 to DQm.

Furthermore, the controller 30 and the memory device 10 may exchange the control signals #CON. The control signals #CON may include a chip enable signal CE_N, a command latch enable signal CLE, an address latch enable signal ALE, a read enable signal RE_N, a write enable signal WE_N, and a data strobe signal DQS.

The chip enable signal CE_N may be a signal for selecting whether to enable the memory device 10. The command latch enable signal CLE may be a signal for indicating that a signal that is received from the controller 30 is a command. The address latch enable signal ALE may be a signal for indicating that a signal that is received from the controller 30 is an address. The read enable signal RE_N may be generated by the controller 30 after the start of a read operation, and may be a signal that is periodically toggled and used to set timing. The write enable signal WE_N may be a signal that becomes activated by the controller 30 when a command or an address is transmitted. The data strobe signal DQS may be generated by the controller 30 after the start of a write operation, and may be a signal that is periodically toggled and used to match the transfer synchronization of the data #DATA that is transferred between the controller 30 and the memory device 10.

Each of the controller 30 and the memory device 10 may include multiple pads, that is, a pad for transferring the chip enable signal CE_N, a pad for transferring the command latch enable signal CLE, a pad for transferring the address latch enable signal ALE, a pad for transferring the read enable signal RE_N, a pad for transferring the write enable signal WE_N, and a pad for transferring the data strobe signal DQS in order to transfer the control signal #CON.

In particular, referring to FIG. 1 along with FIG. 3, each of the multiple pads for transferring the control signals #CON disclosed in FIG. 3 may mean the second pad PAD2 disclosed in FIG. 1. That is, the detection unit 14 and the signal transfer unit 15 disclosed in FIG. 1 may be redundantly included in the memory device 10 by the number of multiple pads for transferring the control signals #CON. In an embodiment, the memory device 10 may include the detection unit 14 and the signal transfer unit 15 corresponding to the pad for transferring the chip enable signal CE_N, the detection unit 14 and the signal transfer unit 15 corresponding to the pad for transferring the command latch enable signal CLE, the detection unit 14 and the signal transfer unit 15 corresponding to the pad for transferring the address latch enable signal ALE, the detection unit 14 and the signal transfer unit 15 corresponding to the pad for transferring the read enable signal RE_N, the detection unit 14 and the signal transfer unit 15 corresponding to the pad for transferring the write enable signal WE_N, and the detection unit 14 and the signal transfer unit 15 corresponding to the pad for transferring the data strobe signal DQS.

More specifically, an embodiment of a form of the control signal #CON that is transferred between the controller 30 and the memory device 10 is described as follows.

In an embodiment, while activating the chip enable signal CE_N, activating the command latch enable signal CLE, deactivating the address latch enable signal ALE, and toggling the write enable signal WE_N among the control signals #CON, the controller 30 may output the command #CMD through the first to m-th I/O pads DQ1 to DQm. The memory device 10 may identify that a signal applied to the first to m-th I/O pads DQ1 to DQm in response to the control signal #CON applied by the controller 30 is the command #CMD.

In an embodiment, while activating the chip enable signal CE_N, deactivating the command latch enable signal CLE, activating the address latch enable signal ALE, and toggling the write enable signal WE_N among the control signals #CON, the controller 30 may output the address #ADD through the first to m-th I/O pads DQ1 to DQm. The memory device 10 may identify that a signal applied to the first to m-th I/O pads DQ1 to DQm in response to the control signal #CON applied by the controller 30 is the address #ADD.

In an embodiment, the controller 30 may activate the chip enable signal CE_N, may deactivate the command latch enable signal CLE, may deactivate the address latch enable signal ALE, may deactivate the write enable signal WE_N, may deactivate the read enable signal RE_N, and may periodically toggle the data strobe signal DQS among the control signals #CON, and may output the data #DATA through the first to m-th I/O pads DQ1 to DQm in synchronization with the toggling of the data strobe signal DQS. The memory device 10 may identify that a signal applied to the first to m-th I/O pads DQ1 to DQm in synchronization with the data strobe signal DQS in response to the control signal #CON applied by the controller 30 is the data #DATA.

In an embodiment, the controller 30 may output the chip enable signal CE_N, the command latch enable signal CLE, the address latch enable signal ALE, the write enable signal WE_N, and the read enable signal RE_N by activating the chip enable signal CE_N, deactivating the command latch enable signal CLE, deactivating the address latch enable signal ALE, deactivating the write enable signal WE_N, and periodically toggling the read enable signal RE_N. The memory device 10 may output the data #DATA read in response to a read command previously received from the controller 30 through the first to m-th I/O pads DQ1 to DQm, in response to the control signal #CON applied by the controller 30. At this time, the memory device 10 may generate the data strobe signal DQS that is periodically toggled in response to the read enable signal RE_N among the control signals #CON applied by the controller 30 and periodically toggled, and may output, to the controller 30, the generated data strobe signal DQS. Furthermore, the memory device 10 may synchronize, with the data strobe signal DQS, the data #DATA that is output to the controller 30 through the first to m-th I/O pads DQ1 to DQm. The controller 30 may receive the data #DATA applied to the first to m-th I/O pads DQ1 to DQm in response to the toggling of the data strobe signal DQS applied by the memory device 10.

Figure 4:
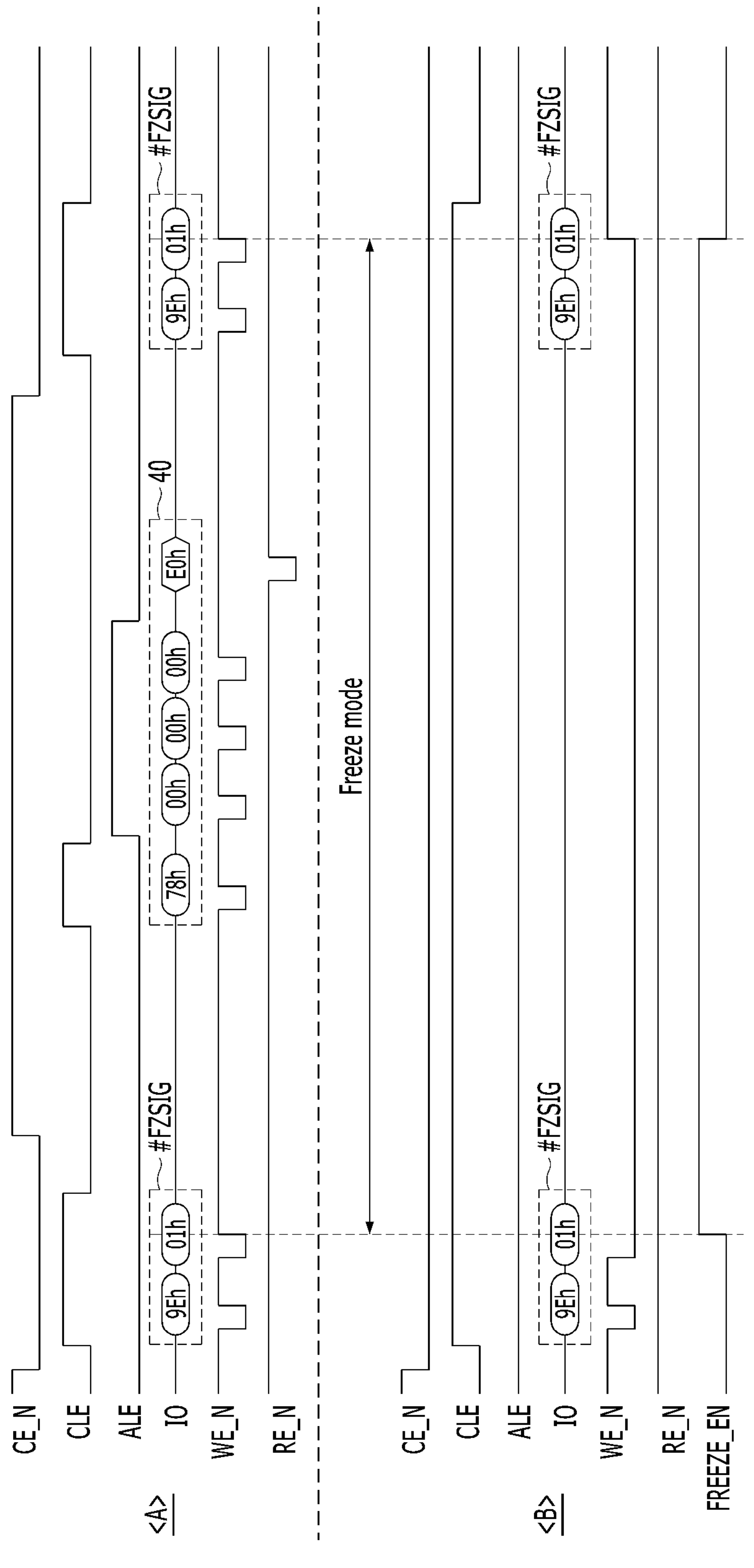
FIG. 4 is a timing diagram for describing an operation of the memory device according to the first embodiment of the present disclosure, which is illustrated in FIG. 1.

FIG. 4 is a timing diagram for describing an operation of the memory device according to the first embodiment of the present disclosure, which is illustrated in FIG. 1.

How the memory device 10 according to an embodiment of the present disclosure operates in the entry interval of the freeze mode is illustrated with reference to FIG. 4.

Referring to both FIGS. 3 and 4, the data #DATA, the command #CMD, and the address #ADD may be input to the memory device 10 in common through the first to m-th I/O pads DQ1 to DQm that are included in the memory device 10. Accordingly, in FIG. 4, reference numeral "DQ" may mean a signal (#FZSIG, 78Eh, 00*h*, or E0*h*) applied to the first to m-th I/O pads DQ1 to DQm. That is, in FIG. 4, reference numeral "DQ" may mean a signal applied to the first pad PAD1 of the memory device 10.

Furthermore, the control signals #CON may include the chip enable signal CE_N, the command latch enable signal CLE, the address latch enable signal ALE, the read enable signal RE_N, the write enable signal WE_N, and the data strobe signal DQS. Accordingly, in FIG. 4, each of reference numerals "CE_N, CLE, ALE, WE_N, and RE_N" may mean an operation of each of the chip enable signal CE_N, the command latch enable signal CLE, the address latch enable signal ALE, the read enable signal RE_N, and the write enable signal WE_N applied to the second pad PAD2.

Referring to <A> of FIG. 4, the memory device 10 may receive a first freeze signal #FZSIG through the first pad PAD1, and may receive the control signal #CON through the second pad PAD2. Thereafter, the memory device 10 may receive a second freeze signal #FZSIG through the first pad PAD1, and may receive the control signal #CON through the second pad PAD2.

In this case, each of the first and second freeze signals #FZSIG may be one of the commands #CMD. That is, when each of the first and second freeze signals #FZSIG is applied to the first pad PAD1 of the memory device 10 among the control signals #CON applied to the second pad PAD2 of the memory device 10, the chip enable signal CE_N may have a state in which the chip enable signal CE_N stays activated to a logic low level, the command latch enable signal CLE may have a state in which the command latch enable signal CLE stays activated to a logic high level, the address latch enable signal ALE may have a state in which the address latch enable signal ALE stays deactivated to a logic low level, the write enable signal WE_N may be toggled, and the read enable signal RE_N may not be toggled.

In an interval until the second freeze signal #FZSIG is applied after the first freeze signal #FZSIG is applied to the first pad PAD1, the memory device 10 may receive one (78*h* in 40) of the commands #CMD, one (00*h*, 00*h*, or 00*h* in 40) of the addresses #ADD, and one (E0*h* in 40) of the data #DATA through the first pad PAD1, and may receive the control signal #CON through the second pad PAD2.

Specifically, when one (78*h* in 40) of the commands #CMD is applied to the first pad PAD1 among the control signals #CON applied to the second pad PAD2, the chip enable signal CE_N may have a state in which the chip enable signal CE_N stays deactivated to a logic high level, the command latch enable signal CLE may have a state in which the command latch enable signal CLE stays activated to a logic high level, the address latch enable signal ALE may have a state in which the address latch enable signal ALE stays deactivated to a logic low level, the write enable signal WE_N may be toggled, and the read enable signal RE_N may not be toggled.

Furthermore, when one (00*h*, 00*h*, or 00*h* in 40) of the addresses #ADD is applied to the first pad PAD1 among the control signals #CON applied to the second pad PAD2, the chip enable signal CE_N may have a state in which the chip enable signal CE_N stays deactivated to a logic high level, the command latch enable signal CLE may have a state in which the command latch enable signal CLE stays deactivated to a logic low level, the address latch enable signal ALE may have a state in which the address latch enable signal ALE stays activated to a logic high level, the write enable signal WE_N may be toggled, and the read enable signal RE_N may not be toggled.

Furthermore, when one (E0*h* in 40) of the data #DATA is applied to the first pad PAD1 among the control signals #CON applied to the second pad PAD2, the chip enable signal CE_N may have a state in which the chip enable signal CE_N stays deactivated to a logic high level, the command latch enable signal CLE may have a state in which the command latch enable signal CLE stays deactivated to a logic low level, the address latch enable signal ALE may have a state in which the address latch enable signal ALE stays deactivated to a logic low level, the write enable signal WE_N may not be toggled, and the read enable signal RE_N may be toggled.

As described above, when the signal 40 is applied to the first pad PAD1 of the memory device 10, it may be seen that the chip enable signal CE_N among the control signals #CON applied to the second pad PAD2, has a state in which the chip enable signal CE_N stays deactivated to a logic high level. That is, the signal 40 applied to the first pad PAD1 of the memory device 10 may be a signal that is not used in the memory device 10. Although not materialized, the signal 40 applied to the first pad PAD1 of the memory device 10 may be a signal that is used in another memory device that shares a channel with the memory device 10.

Referring to <B> of FIG. 4, the memory device 10 may enter the freeze mode by activating the operating state signal FREEZE_EN to a logic high level, in response to the first freeze signal #FZSIG applied to the first pad PAD1. That is, since the operating state signal FREEZE_EN stays deactivated to a logic low level and the memory device 10 has exited from the freeze mode before the first freeze signal #FZSIG is applied to the first pad PAD1, the memory device 10 may enter the freeze mode by activating the operating state signal FREEZE_EN to a logic high level in response to the first freeze signal #FZSIG applied to the first pad PAD1.

Furthermore, the memory device 10 may exit from the freeze mode by deactivating the operating state signal FREEZE_EN to a logic low level in response to the second freeze signal #FZSIG applied to the first pad PAD1. That is, since the operating state signal FREEZE_EN stays activated to a logic high level and the memory device 10 has entered the freeze mode before the second freeze signal #FZSIG is applied to the first pad PAD1, the memory device 10 may exit from the freeze mode by deactivating the operating state signal FREEZE_EN to a logic low level, in response to the second freeze signal #FZSIG applied to the first pad PAD1.

Furthermore, the memory device 10 may detect, in response to the first freeze signal #FZSIG applied to the first pad PAD1, the logic level of the control signal #CON applied to the second pad PAD2 at a time point when the operating state signal FREEZE_EN switches from a logic low level to a logic high level, and may transfer, to the internal operation execution unit 13, the signal IN_CON having the detected logic level of the control signal #CON. At this time, the signal IN_CON having the detected logic level of the control signal #CON may maintain, in response to the second freeze signal #FZSIG applied to the first pad PAD1, the logic level of the signal IN_CON until a time point when the operating state signal FREEZE_EN switches from a logic high level to a logic low level, that is, in the entry interval of the freeze mode in which the logic level of the operating state signal FREEZE_EN stays at a logic high level.

In an embodiment, the memory device 10 may transfer, to the internal operation execution unit 13 while the logic level of the chip enable signal CE_N stays at a logic low level in the entry interval of the freeze mode, the chip enable signal CE_N having a logic level detected as a logic low level at the time point of entering the freeze mode.

In an embodiment, the memory device 10 may transfer, to the internal operation execution unit 13 while the logic level of the command latch enable signal CLE stays at a logic high level in the entry interval of the freeze mode, the command latch enable signal CLE having a logic level detected as a logic high level at the time point of entering the freeze mode.

In an embodiment, the memory device 10 may transfer, to the internal operation execution unit 13 while the logic level of the address latch enable signal ALE stays at a logic low level in the entry interval of the freeze mode, the address latch enable signal ALE having a logic level detected as a logic low level at the time point of entering the freeze mode.

In an embodiment, the memory device 10 may transfer, to the internal operation execution unit 13 while the logic level of the write enable signal WE_N stays at a logic low level in the entry interval of the freeze mode, the write enable signal WE_N having a logic level detected as a logic low level at the time point of entering the freeze mode.

In an embodiment, the memory device 10 may transfer, to the internal operation execution unit 13 while the logic level of the read enable signal RE_N stays at a logic high level in the entry interval of the freeze mode, the read enable signal RE_N having a logic level detected as a logic high level at the time point of entering the freeze mode.

Thus, even after the freeze signal #FZSIG was applied to the first pad PAD1 and the memory device 10 entered the freeze mode, the command signal (78*h* in 40), the address signals (00*h*, 00*h*, and 00*h* in 40), and the data (E0*h* in 40) may be applied to the first pad PAD1, and the control signal #CON may be applied to the second pad PAD2.

However, the memory device 10 in the freeze mode may ignore the signal 40 applied to the first pad PAD1. That is, the memory device 10 in the freeze mode may transfer, to the internal operation execution unit 13 in the entry interval of the freeze mode, the signal IN_CON having a logic level of the control signal #CON detected at a time point of entering the freeze mode.

Accordingly, after the memory device 10 has entered the freeze mode, although any signal is applied to a channel connected to the first pad PAD1 and the second pad PAD2, the memory device 10 may have a state in which an operation within the memory device 10 is not affected.

Second Embodiment

Figure 5:
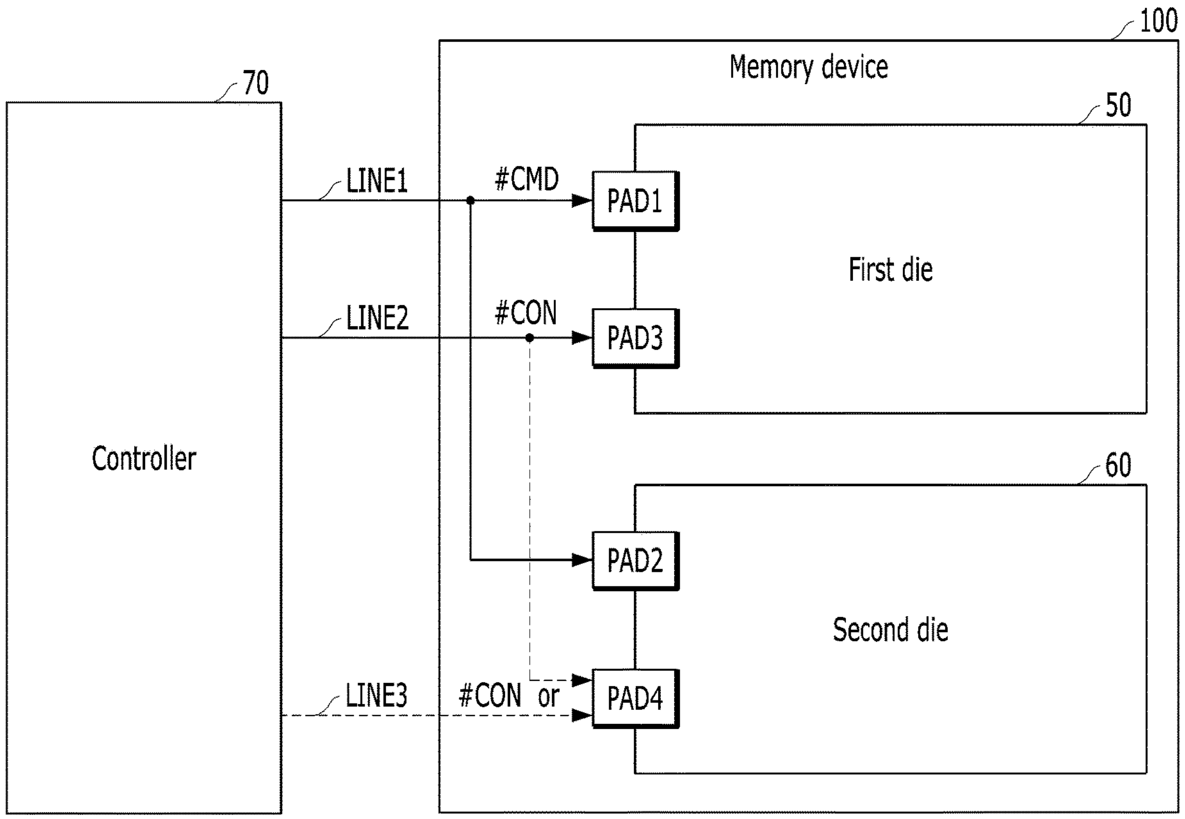
FIG. 5 is a diagram for describing an example of a memory system according to a second embodiment of the present disclosure.

FIG. 5 is a diagram for describing an example of a memory system according to a second embodiment of the present disclosure.

Referring to FIG. 5, the data processing system 100 may include a host 102 engaged or coupled with a memory system, such as memory system 110. For example, the host 102 and the memory system 110 can be coupled to each other via a data bus, a host cable and the like to perform data communication.

The memory system 110 may include a memory device 150 and a controller 130. The memory device 150 and the controller 130 in the memory system 110 may be considered components or elements physically separated from each other. The memory device 150 and the controller 130 may be connected via at least one data path. For example, the data path may include a channel and/or a way.

According to an embodiment, the memory device 150 and the controller 130 may be components or elements functionally divided. Further, according to an embodiment, the memory device 150 and the controller 130 may be implemented with a single chip or a plurality of chips. The controller 130 may perform a data input/output operation in response to a request input from the external device. For example, when the controller 130 performs a read operation in response to a read request input from an external device, data stored in a plurality of non-volatile memory cells included in the memory device 150 is transferred to the controller 130.

The memory device 100 may include a first memory die 50 and a second memory die 60. For reference, in this drawing, the two memory dies 50 and 60 have been illustrated as being included in the memory device 100, but this is merely an embodiment. More memory dies may be included in the memory device 100.

For example, the memory system 110 may be implemented with any of various types of storage devices, which may be electrically coupled with the host 102, according to a protocol of a host interface. Non-limiting examples of suitable storage devices include a solid state drive (SSD), a multimedia card (MMC), an embedded MMC (eMMC), a reduced size MMC (RS-MMC), a micro-MMC, a secure digital (SD) card, a mini-SD, a micro-SD, a universal serial bus (USB) storage device, a universal flash storage (UFS) device, a compact flash (CF) card, a smart media (SM) card, a memory stick, and the like.

Each of the first memory die 50 and the second memory die 60 that are included in the memory device 100 may store data. Each of the first memory die 50 and the second memory die 60 that are included in the memory device 100 may operate in response to control of the controller 70. In this case, the first memory die 50 and the second memory die 60 may operate in a fully independent form. Each of the first memory die 50 and the second memory die 60 may include a memory cell array (not illustrated) that includes multiple memory cells in which data is stored.

In an embodiment, each of the first memory die 50 and the second memory die 60 are embodied as a non-volatile memory such as a flash memory, for example, a NAND flash memory, a NOR flash memory, or the like. In another embodiment, the memory device 150 may be implemented by at least one of a phase change random access memory (PCRAM), a ferroelectrics random access memory (FRAM), a transfer torque random access memory (STT-RAM), and a spin transfer torque magnetic random access memory (STT-MRAM), or the like.

In the present disclosure, it is described that each of the first memory die 50 and the second memory die 60 is NAND flash memory.

The memory cell array (not illustrated) that is included in each of the first memory die 50 and the second memory die 60 may include multiple memory blocks. Each of the memory blocks may include multiple memory cells. One memory block may include multiple pages. In an embodiment, the page may be a unit by which data is written (or programmed) in each of the first memory die 50 and the second memory die 60 or by which data stored in each of the first memory die 50 and the second memory die 60 is read. The memory block may be a unit by which data is erased.

Each of the first memory die 50 and the second memory die 60 may be configured to receive a command and an address from the controller 70 and to access a region that belongs to the memory cell array and selected by the address. Each of the first memory die 50 and the second memory die 60 may perform, on the region selected by the address, an operation that is indicated by the command. For example, each of the first memory die 50 and the second memory die 60 may perform a write operation (or a program operation), a read operation, and an erase operation. After the start of the program operation, each of the first memory die 50 and the second memory die 60 will write data in the region selected by the address. After the start of the read operation, each of the first memory die 50 and the second memory die 60 will read data from the region selected by the address. After the start of the erase operation, each of the first memory die 50 and the second memory die 60 will erase data stored in the region selected by the address.

The controller 70 may control an overall operation of each of the first memory die 50 and the second memory die 60.

The controller 70 may control each of the first memory die 50 and the second memory die 60 to perform a program operation, a read operation, or an erase operation in response to a request from a host. After the start of the program operation, the controller 70 may provide a write command, an address, and data to each of the first memory die 50 and the second memory die 60. After the start of the read operation, the controller 70 may provide a read command and an address to each of the first memory die 50 and the second memory die 60. After the start of the erase operation, the controller 70 may provide an erase command and an address to each of the first memory die 50 and the second memory die 60.

In an embodiment, the controller 70 may autonomously generate a command, an address, and data regardless of a request from the host, and may transmit the command, the address, and the data to the first memory die 50 and the second memory die 60, respectively. For example, the controller 130 may provide commands, addresses, and data to the first memory die 50 and the second memory die 60, respectively, so as to perform background operations, such as a program operation for wear leveling and a program operation for garbage collection.

The command #CMD and the control signal #CON that are generated by the controller 70 may be transferred to the first memory die 50 and the second memory die 60 by using methods according to two types of the following embodiments.

In the first method, the controller 70 may apply a command #CMD that is generated within the controller 70 to a first pad PAD1 of the first memory die 50 and a second pad PAD2 of the second memory die 60 through the first line LINE1. Furthermore, the controller 70 may apply a control signal #CON that is generated within the controller 70 to a third pad PAD3 of the first memory die 50 and a fourth pad PAD4 of the second memory die 60 through a second line LINE2.

That is, in the first method, the first memory die 50 and the second memory die 60 may be connected to the controller 70 by sharing the first line LINE1, and may be connected to the controller 70 by sharing the second line LINE2. To put it shortly, each of the first memory die 50 and the second memory die 60 may share all lines that are connected to the controller 70, and may not have a line that is dedicatedly connected to each of the first memory die 50 and the second memory die 60. That is, in this drawing, only the first line LINE1 and the second line LINE2 may be present, and a third line LINE3 may not be present.

In accordance with the connection relation according to the first method, the command #CMD that is generated by the controller 70 may be transmitted to the first memory die 50 and the second memory die 60 in common. Furthermore, a control signal #CON that is generated by the controller 70 may be transmitted to the first memory die 50 and the second memory die 60 in common.

In the second method, the controller 70 may apply the command #CMD that is generated within the controller 70 to the first pad PAD1 of the first memory die 50 and the second pad PAD2 of the second memory die 60 through the first line LINE1. Furthermore, the controller 70 may apply "some" of the control signals #CON that are generated within the controller 70 to the third pad PAD3 of the first memory die 50 and the fourth pad PAD4 of the second memory die 60 through the second line LINE2, and may apply "the remainder" of the control signals #CON except the "some" to the third pad PAD3 of the first memory die 50 through the second line LINE2 and to the fourth pad PAD4 of the second memory die 60 through the third line LINE3.

That is, in the second method, the first memory die 50 and the second memory die 60 may be connected to the controller 70 by sharing the first line LINE1, and may be connected to the controller 70 by sharing "some" of the second lines LINE2. Furthermore, the first memory die 50 may be connected to the controller 70 by dedicatedly using "the remainder" of the second lines LINE2 except the "some" that is shared with the second memory die 60 among the second lines LINE2. Furthermore, the second memory die 60 may be connected to the controller 70 by dedicatedly using the third line LINE3.

In accordance with the connection relation according to the second method, the command #CMD that is generated by the controller 70 may be transmitted to the first memory die 50 and the second memory die 60 in common. Furthermore, "some" of the control signals #CON that are generated by the controller 70 may be transmitted to the first memory die 50 and the second memory die 60 in common. Furthermore, "the remainder" of the control signals #CON that are generated by the controller 70, except the "some" of the control signals #CON, may be independently transmitted to each of the first memory die 50 and the second memory die 60.

Figure 6A:
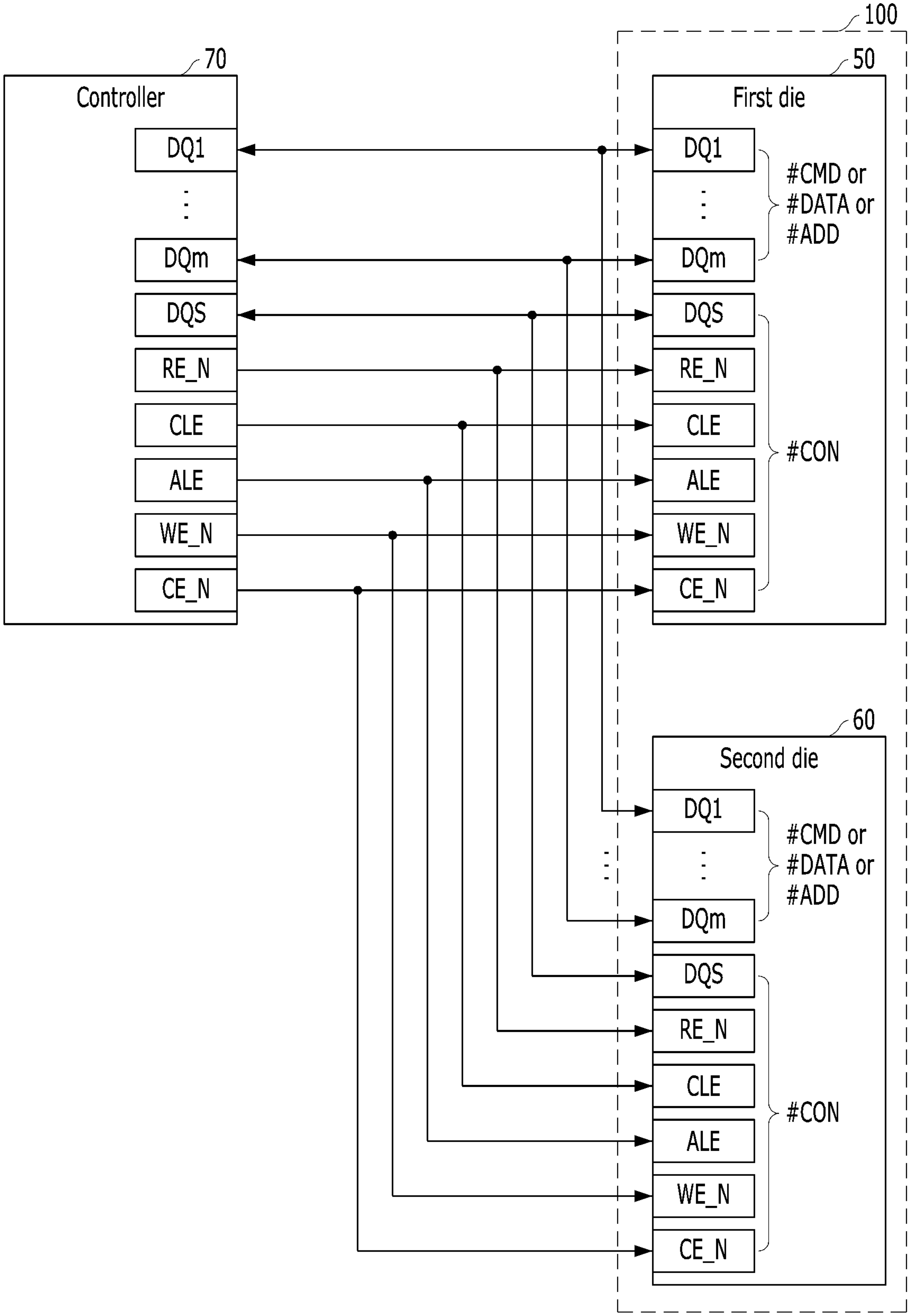
FIG. 6A is a diagram for describing an example of the memory system according to the second embodiment of the present disclosure, which is illustrated in FIG. 5.

FIG. 6A is a diagram for describing an example of the memory system according to the second embodiment of the present disclosure, which is illustrated in FIG. 5.

Figure 6B:
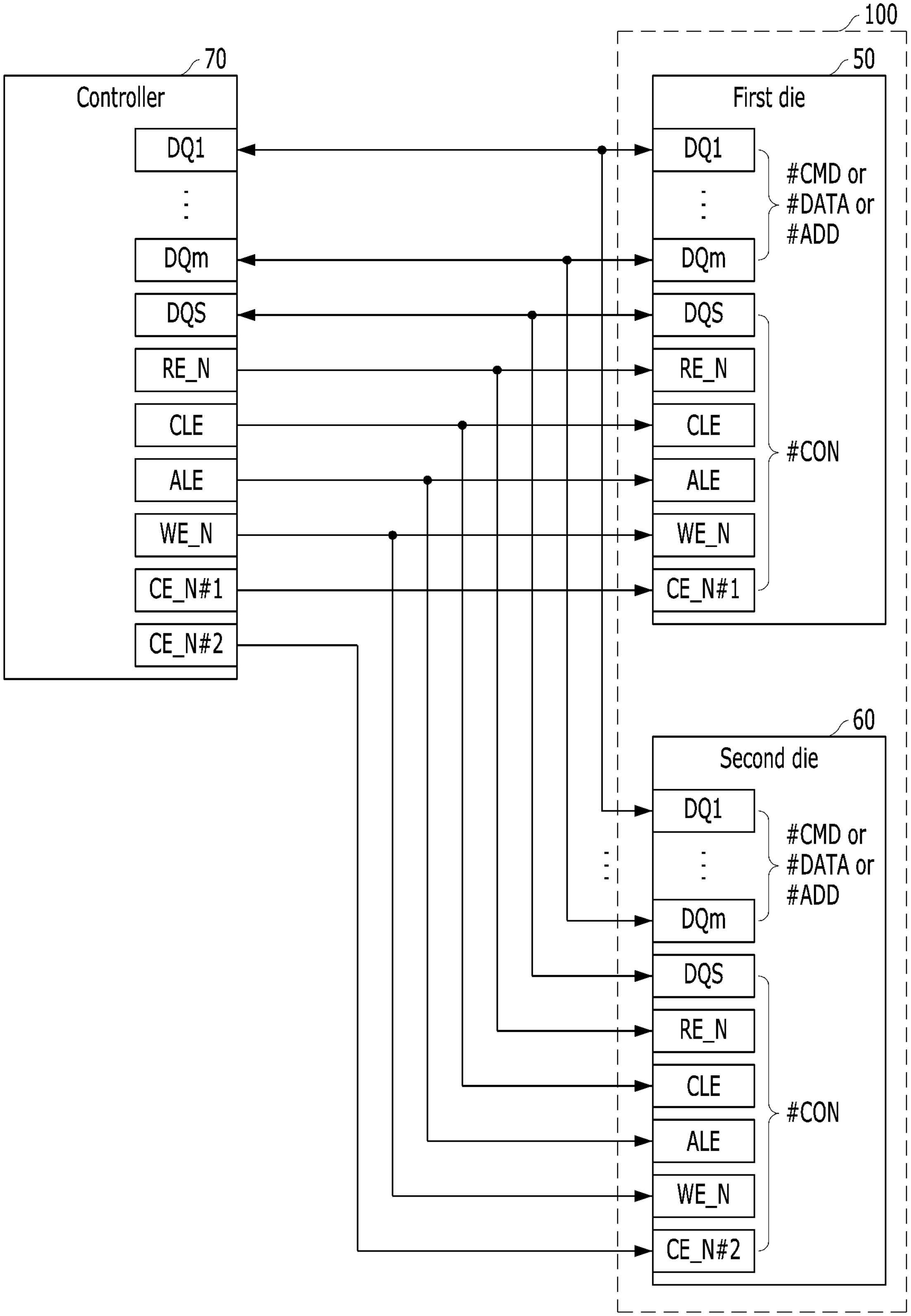
FIG. 6B is a diagram for describing another example of the memory system according to the second embodiment of the present disclosure, which is illustrated in FIG. 5.

FIG. 6B is a diagram for describing another example of the memory system according to the second embodiment of the present disclosure, which is illustrated in FIG. 5.

First, it may be seen that FIG. 6A is a drawing specifically illustrating a case in which the command #CMD and the control signal #CON that are generated by the controller 70 are transmitted to the first memory die 50 and the second memory die 60 that are included in the memory device 100 according to the first method described with reference to FIG. 5.

Specifically, the controller 70, and the first memory die 50 and the second memory die 60 that are included in the memory device 100 may exchange the data #DATA, the command #CMD, and the address #ADD through a common channel. Each of the controller 70, the first memory die 50, and the second memory die 60 may include the first to m-th I/O pads DQ1 to DQm. The controller 70, the first memory die 50, and the second memory die 60 may exchange the data #DATA, the command #CMD, and the address #ADD through the first to m-th I/O pads DQ1 to DQm that are included in each of the controller 70, the first memory die 50, and the second memory die 60. In an embodiment, a signal that is transmitted through the first to m-th I/O pads DQ1 to DQm in response to a form of the control signal #CON may be identified as one of the data #DATA, the command #CMD, or the address #ADD. In an embodiment, m may be a natural number equal to or greater than 2.

In particular, all first to m-th I/O pads DQ1 to DQm that are included in the first memory die 50 disclosed in FIG. 6A may mean the first pad PAD1 disclosed in FIG. 5. Furthermore, all first to m-th I/O pads DQ1 to DQm that are included in the second memory die 60 disclosed in FIG. 6A may mean the second pad PAD2 disclosed in FIG. 5. Accordingly, as described with reference to FIG. 5, it may be seen that the first memory die 50 and the second memory die 60 have a form in which the first memory die 50 and the second memory die 60 share a line connected to the first to m-th I/O pads DQ1 to DQm that are included in each of the first memory die 50 and the second memory die 60, for example, the first line LINE1.

Furthermore, the controller 70 and each of the first memory die 50 and the second memory die 60 may exchange the control signals #CON. The control signal #CON may include the chip enable signal CE_N, the command latch enable signal CLE, the address latch enable signal ALE, the read enable signal RE_N, the write enable signal WE_N, and the data strobe signal DQS.

The chip enable signal CE_N may be a signal for selecting whether to enable each of the first memory die 50 and the second memory die 60. The command latch enable signal CLE may be a signal for indicating that a signal that is received from the controller 70 is a command. The address latch enable signal ALE may be a signal for indicating that a signal that is received from the controller 70 is an address. The read enable signal RE_N may be generated by the controller 70 after the start of a read operation, and may be a signal that is periodically toggled and used to set timing. The write enable signal WE_N may be a signal that becomes activated by the controller 70 when a command or an address is transmitted. The data strobe signal DQS may be generated by the controller 70 after the start of a write operation, and may be a signal that is periodically toggled and used to match the transfer synchronization of the data #DATA that is transferred between the controller 70 and each of the first memory die 50 and the second memory die 60.

Each of the controller 70, the first memory die 50, and the second memory die 60 may include multiple pads, that is, a pad for transferring the chip enable signal CE_N, a pad for transferring the command latch enable signal CLE, a pad for transferring the address latch enable signal ALE, a pad for transferring the read enable signal RE_N, a pad for transferring the write enable signal WE_N, and a pad for transferring the data strobe signal DQS in order to transfer the control signal #CON.

In particular, each of the multiple pads for transferring the control signals #CON, which are included in the first memory die 50 disclosed in FIG. 6A, may mean the third pad PAD3 disclosed in FIG. 5. Furthermore, each of the multiple pads for transferring the control signals #CON, which are included in the second memory die 60 disclosed in FIG. 6A, may mean the fourth pad PAD4 disclosed in FIG. 5. Accordingly, as described with reference to FIG. 5, it may be seen that the first memory die 50 and the second memory die 60 have a form in which the first memory die 50 and the second memory die 60 share all lines that are connected to the multiple pads for transferring the control signals #CON, which are included in each of the first memory die 50 and the second memory die 60, for example, the second line LINE2.

Furthermore, it may be seen that FIG. 6B is a drawing specifically illustrating a case in which the command #CMD and the control signal #CON that are generated by the controller 70 are transmitted to the first memory die 50 and the second memory die 60 according to the second method described with reference to FIG. 5.

Specifically, as in FIG. 6A, and in FIG. 6B, each of the controller 70, and the first memory die 50 and the second memory die 60 that are included in the memory device 100 may include the first to m-th I/O pads DQ1 to DQm. The controller 70, the first memory die 50, and the second memory die 60 may exchange the data #DATA, the command #CMD, and the address #ADD through the first to m-th I/O pads DQ1 to DQm.

In particular, all first to m-th I/O pads DQ1 to DQm that are included in the first memory die 50 disclosed in FIG. 6B may mean the first pad PAD1 disclosed in FIG. 5. Furthermore, all first to m-th I/O pads DQ1 to DQm that are included in the second memory die 60 disclosed in FIG. 6B may mean the second pad PAD2 disclosed in FIG. 5. Accordingly, as described with reference to FIG. 5, it may be seen that the first memory die 50 and the second memory die 60 have a form in which the first memory die 50 and the second memory die 60 share lines that are connected to the first to m-th I/O pads DQ1 to DQm that are included in each of the first memory die 50 and the second memory die 60, for example, the first line LINE1.

Furthermore, the controller 70 and each of the first memory die 50 and the second memory die 60 may exchange the control signals #CON. The control signals #CON may include a first chip enable signal CE_N #1 that is dedicatedly used for the first memory die 50, a second chip enable signal CE_N #2 that is dedicatedly used for the second memory die 60, a second command latch enable signal CLE that is used for the first memory die 50 and the second memory die 60 in common, the address latch enable signal ALE, the read enable signal RE_N, the write enable signal WE_N, and the data strobe signal DQS.

The first chip enable signal CE_N #1 may be a signal for selecting whether to enable the first memory die 50. The second chip enable signal CE_N #2 may be a signal for selecting whether to enable the second memory die 60. The command latch enable signal CLE may be a signal for indicating that a signal that is received from the controller 70 is a command. The address latch enable signal ALE may be a signal for indicating that a signal that is received from the controller 70 is an address. The read enable signal RE_N may be generated by the controller 70 after the start of a read operation, and may be a signal that is periodically toggled and used to set timing. The write enable signal WE_N may be a signal that becomes activated by the controller 70 when a command or an address is transmitted. The data strobe signal DQS may be generated by the controller 70 after the start of a write operation, and may be a signal that is periodically toggled and used to match the transfer synchronization of the data #DATA that is transferred between the controller 70 and each of the first memory die 50 and the second memory die 60.

Each of the controller 70 and the first memory die 50 may include multiple pads in order to transfer the control signals #CON, that is, a pad for transferring the first chip enable signal CE_N #1, a pad for transferring the command latch enable signal CLE, a pad for transferring the address latch enable signal ALE, a pad for transferring the read enable signal RE_N, a pad for transferring the write enable signal WE_N, and a pad for transferring the data strobe signal DQS.

Furthermore, each of the controller 70 and the second memory die 60 may include multiple pads in order to transfer the control signals #CON, that is, a pad for transferring the second chip enable signal CE_N #2, a pad for transferring the command latch enable signal CLE, a pad for transferring the address latch enable signal ALE, a pad for transferring the read enable signal RE_N, a pad for transferring the write enable signal WE_N, and a pad for transferring the data strobe signal DQS.

In particular, each of the multiple pads for transferring the control signals #CON, which are included in the first memory die 50 disclosed in FIG. 6B, may mean the third pad PAD3 disclosed in FIG. 5. Furthermore, each of the multiple pads for transferring the control signals #CON, which are included in the second memory die 60 disclosed in FIG. 6B, may mean the fourth pad PAD4 disclosed in FIG. 5.

However, as described with reference to FIG. 5, it may be seen that the first memory die 50 and the second memory die 60 have a form in which the first memory die 50 and the second memory die 60 share "some" of lines for transferring the remaining signals CLE, ALE, RE_N, WE_N, and DQS except the chip enable signals CE_N #1 and CE_N #2, which are included in each of the first memory die 50 and the second memory die 60 among the control signals #CON, for example, the second line LINE2. Furthermore, it may be seen that the first memory die 50 has a form in which the first memory die 50 dedicatedly uses "the remainder" of lines for transferring the first chip enable signal CE_N #1 among the control signals #CON, for example, except "some" of the second lines LINE2. Furthermore, it may be seen that the second memory die 60 has a form in which the second memory die 60 dedicatedly uses a line for transferring the second chip enable signal CE_N #2 among the control signals #CON, for example, the third line LINE3.

Figure 7:
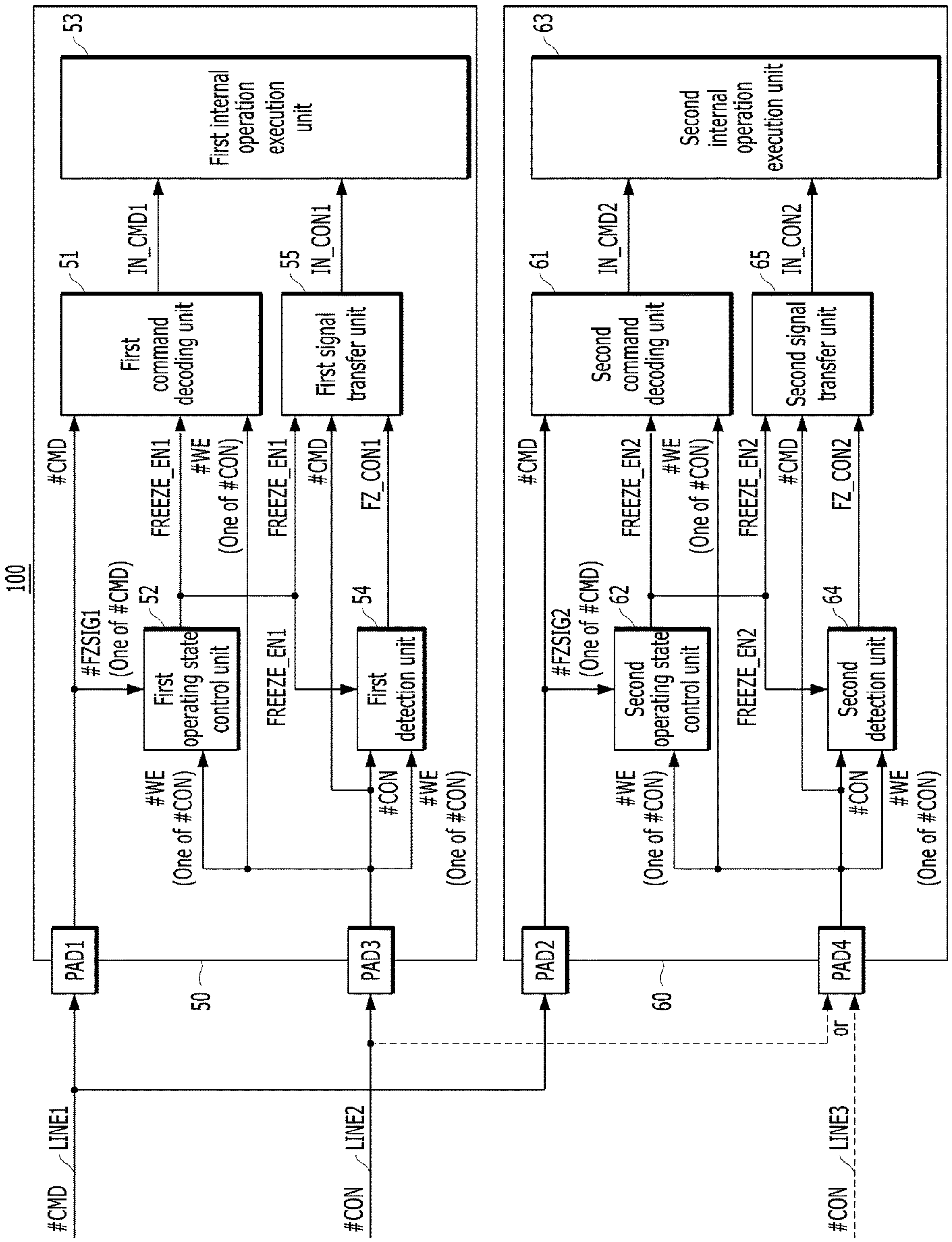
FIG. 7 is a diagram for describing an example of a memory device according to a second embodiment of the present disclosure.

FIG. 7 is a diagram for describing an example of a memory device according to a second embodiment of the present disclosure.

Referring to FIG. 7, a memory device 100 according to the second embodiment of the present disclosure may include a first memory die 50 and a second memory die 60. The first memory die 50 may include a first command decoding unit 51, a first operating state control unit 52, a first internal operation execution unit 53, a first detection unit 54, and a first signal transfer unit 55. The second memory die 60 may include a second command decoding unit 61 and a second operating state control unit 62 and a second internal operation execution unit 63 and a second detection unit 64 and a second signal transfer unit 65.

In this case, the first command decoding unit 51 may be enabled while a first operating state signal FREEZE_EN1 stays deactivated, and may generate a first internal command IN_CMD1 by decoding an input signal #CMD applied to a first pad PAD1. The first command decoding unit 51 may be disabled while the first operating state signal FREEZE_EN1 stays activated.

The first command decoding unit 51 may receive the input signal #CMD applied to the first pad PAD1 in response to an input reference signal #WE among input signals #CON applied to the third pad PAD3, in the state in which the first command decoding unit 51 has been enabled. In an embodiment, the first command decoding unit 51 may receive the input signal #CMD applied to the first pad PAD1, in response to a rising edge of the input reference signal #WE applied to a third pad PAD3.

The first operating state control unit 52 may deactivate the first operating state signal FREEZE_EN1 that stays activated or may activate the first operating state signal FREEZE_EN1 that stays deactivated, in response to a first freeze signal #FZSIG1 among the input signals #CMD applied to the first pad PAD1. In an embodiment, the first operating state control unit 52 may switch the first operating state signal FREEZE_EN1 from a deactivation state to an activation state by switching the first operating state signal FREEZE_EN1 from a logic low level to a logic high level, in response to the first freeze signal #FZSIG1 among the input signals #CMD applied to the first pad PAD1. In an embodiment, the first operating state control unit 52 may switch the first operating state signal FREEZE_EN1 from the activation state to the deactivation state by switching the first operating state signal FREEZE_EN1 from a logic high level to a logic low level, in response to the first freeze signal #FZSIG1 among the input signals #CMD applied to the first pad PAD1.

In this case, an interval in which the first operating state signal FREEZE_EN1 stays activated may be defined as an entry interval of a first freeze mode. That is, the entry interval of the first freeze mode may be an interval in which the first command decoding unit 51 is disabled and does not perform any operation. In contrast, an interval in which the first operating state signal FREEZE_EN1 stays deactivated may be defined as an exit interval of the first freeze mode. That is, the exit interval of the first freeze mode may be an interval in which the first command decoding unit 51 is enabled and performs a normal operation, that is, generates the first internal command IN_CMD1.

The first operating state control unit 52 may ignore the remaining signals of the input signals #CMD except the first freeze signal #FZSIG1 when the remaining signals are applied to the first pad PAD1. That is, the first operating state control unit 52 may not perform any operation in response to the remaining signals except the first freeze signal #FZSIG1 among the input signals #CMD applied to the first pad PAD1.

The first command decoding unit 51 may ignore the first freeze signal #FZSIG1 among the input signals #CMD, when the first freeze signal #FZSIG1 is applied to the first pad PAD1. That is, the first command decoding unit 51 may not perform any operation in response to the first freeze signal #FZSIG1 among the input signals #CMD applied to the first pad PAD1.

The first operating state control unit 52 may receive the first freeze signal #FZSIG1 applied to the first pad PAD1, in response to the input reference signal #WE among the input signals #CON applied to the third pad PAD3. In an embodiment, the first operating state control unit 52 may receive the first freeze signal #FZSIG1 applied to the first pad PAD1, in response to a rising edge of the input reference signal #WE applied to the third pad PAD3.

The first internal operation execution unit 53 may perform a first set internal operation in response to the first internal command IN_CMD1 that is generated by the first command decoding unit 51.

The first detection unit 54 may detect the logic level of the input signal #CON applied to the third pad PAD3 at a time point when the first operating state signal FREEZE_EN1 becomes activated.

The first signal transfer unit 55 may transfer, to the first internal operation execution unit 53, the input signal #CON applied to the third pad PAD3 while the first operating state signal FREEZE_EN1 stays deactivated. The first signal transfer unit 55 may transfer, to the first internal operation execution unit 53 while the first operating state signal FREEZE_EN1 stays activated, a signal FZ_CON1 having the logic level detected by the first detection unit 54.

More specifically, the first internal operation execution unit 53 may include a memory cell array (not illustrated). In an embodiment, the memory cell array that is included in the first internal operation execution unit 53 may include a volatile memory cell. In an embodiment, the memory cell array that is included in the first internal operation execution unit 53 may include a nonvolatile memory cell. In an embodiment, the first internal operation execution unit 53 may perform a write (or program) operation of storing data in the memory cell array within the first internal operation execution unit 53, in response to the first internal command IN_CMD1 that is generated by the first command decoding unit 51. In an embodiment, the first internal operation execution unit 53 may perform a read operation of reading data stored in the memory cell array within the first internal operation execution unit 53, in response to the first internal command IN_CMD1 that is generated by the first command decoding unit 51. In an embodiment, the first internal operation execution unit 53 may perform an erase operation of erasing data stored in the memory cell array within the first internal operation execution unit 53, in response to the first internal command IN_CMD1 that is generated by the first command decoding unit 51.

When the input signal #CMD applied to the first pad PAD1 is the first freeze signal #FZSIG1, the first memory die 50 that is included in the memory device 100 according to the second embodiment of the present disclosure may ignore all input signals #CMD applied to the first pad PAD1 in the entry interval of the first freeze mode by blocking all input signals #CMD in a way to enter the first freeze mode and to disable an operation of the first command decoding unit 51. That is, the first memory die 50 that is included in the memory device 100 according to the second embodiment of the present disclosure can block the input signal #CMD applied to the first pad PAD1 in the entry interval of the first freeze mode.

Furthermore, the first memory die 50 that is included in the memory device 100 according to the second embodiment of the present disclosure may transfer, to the first internal operation execution unit 53, all input signals #CON input to the third pad PAD3 in the entry interval of the first freeze mode, by fixing the logic levels of all input signals #CON to a logic level detected at a time point of entering the first freeze mode. That is, the first memory die 50 that is included in the memory device 100 according to the second embodiment of the present disclosure can block the input signal #CMD applied to the third pad PAD3 in the entry interval of the first freeze mode.

Furthermore, the second command decoding unit 61 may be enabled while a second operating state signal FREEZE_EN2 stays deactivated, and may generate a second internal command IN_CMD2 by decoding the input signal #CMD applied to the second pad PAD2. The second command decoding unit 61 may be disabled while the second operating state signal FREEZE_EN2 stays activated.

The second command decoding unit 61 may receive the input signal #CMD applied to the second pad PAD2, in response to the input reference signal #WE among the input signals #CON applied to a fourth pad PAD4 in the state in which the second command decoding unit 61 has been enabled. In an embodiment, the second command decoding unit 61 may receive the input signal #CMD applied to the second pad PAD2, in response to a rising edge of the input reference signal #WE applied to the fourth pad PAD4.

The second operating state control unit 62 may deactivate the second operating state signal FREEZE_EN2 that stays activated or may activate the second operating state signal FREEZE_EN2 that stays deactivated, in response to a second freeze signal #FZSIG2 among the input signals #CMD applied to the second pad PAD2. In an embodiment, the second operating state control unit 62 may switch the second operating state signal FREEZE_EN2 from a deactivation state to an activation state by switching the second operating state signal FREEZE_EN2 from a logic low level to a logic high level in response to the second freeze signal #FZSIG2 among the input signals #CMD applied to the second pad PAD2. In an embodiment, the second operating state control unit 62 may switch the second operating state signal FREEZE_EN2 from the activation state to the deactivation state by switching the second operating state signal FREEZE_EN2 from a logic high level to a logic low level in response to the second freeze signal #FZSIG2 among the input signals #CMD applied to the second pad PAD2.

In this case, an interval in which the second operating state signal FREEZE_EN2 stays activated may be defined as an entry interval of the second freeze mode. That is, the entry interval of the second freeze mode may be an interval in which the second command decoding unit 61 is disabled and does not perform any operation. In contrast, an interval in which the second operating state signal FREEZE_EN2 stays deactivated may be defined as an exit interval of the second freeze mode. That is, the exit interval of the second freeze mode may be an interval in which the second command decoding unit 61 is enabled and performs a normal operation, that is, generates the second internal command IN_CMD2.

The second operating state control unit 62 may ignore the remaining signals of the input signals #CMD except the second freeze signal #FZSIG2 when the remaining signals are applied to the second pad PAD2. That is, the second operating state control unit 62 may not perform any operation in response to the remaining signals except the second freeze signal #FZSIG2 among the input signals #CMD applied to the second pad PAD2.

The second command decoding unit 61 may ignore the second freeze signal #FZSIG2 among the input signals #CMD, when the second freeze signal #FZSIG2 is applied to the second pad PAD2. That is, the second command decoding unit 61 may not perform any operation in response to the second freeze signal #FZSIG2 among the input signals #CMD applied to the second pad PAD2.

The second operating state control unit 62 may receive the second freeze signal #FZSIG2 applied to the second pad PAD2, in response to the input reference signal #WE among the input signals #CON applied to the fourth pad PAD4. In an embodiment, the second operating state control unit 62 may receive the second freeze signal #FZSIG2 applied to the second pad PAD2, in response to a rising edge of the input reference signal #WE applied to the fourth pad PAD4.

The second internal operation execution unit 63 may perform a second set internal operation in response to the second internal command IN_CMD2 that is generated by the second command decoding unit 61.

The second detection unit 64 may detect the logic level of the input signal #CON applied to the fourth pad PAD4 at a time point when the second operating state signal FREEZE_EN2 becomes activated.

The second signal transfer unit 65 may transfer, to the second internal operation execution unit 63, the input signal #CON applied to the fourth pad PAD4 while the second operating state signal FREEZE_EN2 stays deactivated. The second signal transfer unit 65 may transfer, to the second internal operation execution unit 63 while the second operating state signal FREEZE_EN2 stays activated, a signal FZ_CON2 having the logic level detected by the second detection unit 64.

More specifically, the second internal operation execution unit 63 may include a memory cell array (not illustrated). In an embodiment, the memory cell array that is included in the second internal operation execution unit 63 may include a volatile memory cell. In an embodiment, the memory cell array that is included in the second internal operation execution unit 63 may include a nonvolatile memory cell. In an embodiment, the second internal operation execution unit 63 may perform a write or program operation of storing data in the memory cell array within the second internal operation execution unit 63, in response to the second internal command IN_CMD2 that is generated by the second command decoding unit 61. In an embodiment, the second internal operation execution unit 63 may perform a read operation of reading data stored in the memory cell array within the second internal operation execution unit 63, in response to the second internal command IN_CMD2 that is generated by the second command decoding unit 61. In an embodiment, the second internal operation execution unit 63 may perform an erase operation of erasing data stored in the memory cell array within the second internal operation execution unit 63, in response to the second internal command IN_CMD2 that is generated by the second command decoding unit 61.

When the input signal #CMD applied to the second pad PAD2 is the second freeze signal #FZSIG2, the second memory die 60 that is included in the memory device 100 according to the second embodiment of the present disclosure may ignore all input signals #CMD applied to the second pad PAD2 in the entry interval of the second freeze mode by blocking all input signals #CMD in a way to enter the second freeze mode and to disable an operation of the second command decoding unit 61. That is, the second memory die 60 that is included in the memory device 100 according to the second embodiment of the present disclosure can block the input signal #CMD applied to the second pad PAD2 in the entry interval of the second freeze mode.

Furthermore, the second memory die 60 that is included in the memory device 100 according to the second embodiment of the present disclosure may transfer, to the second internal operation execution unit 63 in the entry interval of the second freeze mode, all input signals #CON input to the fourth pad PAD4 by fixing the logic levels of all input signals #CON to a logic level detected at a time point of entering the second freeze mode. That is, the second memory die 60 that is included in the memory device 100 according to the second embodiment of the present disclosure can block the input signal #CMD applied to the fourth pad PAD4 in the entry interval of the second freeze mode from affecting an operation of the second internal operation execution unit 63.

The operation of the first memory die 50 entering or exiting from the first freeze mode may be performed in response to the first freeze signal #FZSIG1 applied by only the controller 70. Likewise, the operation of the second memory die 60 entering or exiting from the second freeze mode may be performed in response to the second freeze signal #FZSIG2 applied by only the controller 70. In this case, the first freeze signal #FZSIG1 and the second freeze signal #FZSIG2 cannot be simultaneously transferred to the first memory die 50 and the second memory die 60, respectively, but may be consecutively transferred to the first memory die 50 and the second memory die 60, respectively. Accordingly, the entry interval of the first freeze mode corresponding to the first memory die 50 and the entry interval of the second freeze mode corresponding to the second memory die 60 may be different in start timing, and may overlap. If the first freeze signal #FZSIG1 and the second freeze signal #FZSIG2 are transferred to the first memory die 50 and the second memory die 60, respectively, with a sufficient time difference, the entry interval of the first freeze mode corresponding to the first memory die 50 and the entry interval of the second freeze mode corresponding to the second memory die 60 may not overlap.

Figure 8A:
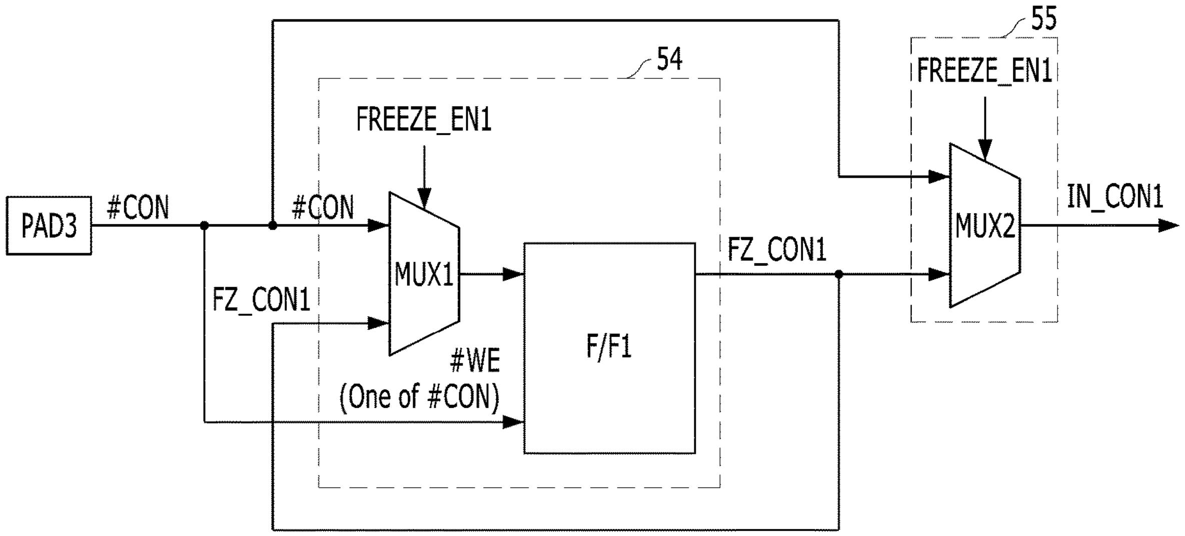
FIGS. 8A and 8B are diagrams for describing examples of first and second detection units, and first and second signal transfer units among components of the memory device according to the second embodiment of the present disclosure, which is illustrated in FIG. 7.
Figure 8B:
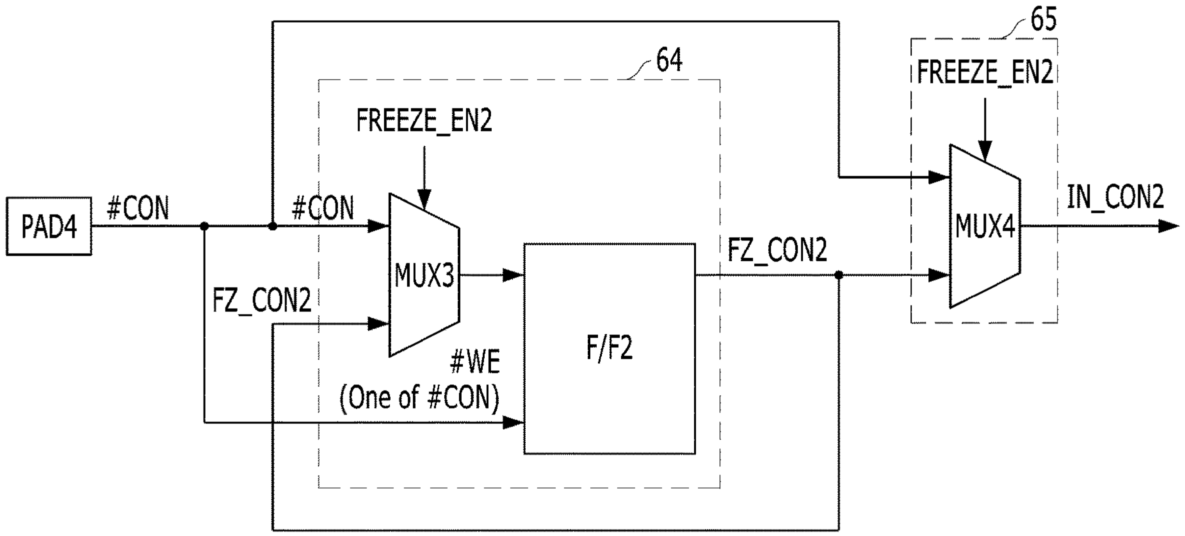

FIGS. 8A and 8B are diagrams for describing examples of the first and second detection units, and the first and second signal transfer units among the components of the memory device according to the second embodiment of the present disclosure, which is illustrated in FIG. 7.

Referring to FIG. 8A, a first detection unit 54 may include a first multiplexer MUX1 and a first flip-flop F/F1. Furthermore, the first signal transfer unit 55 may include a second multiplexer MUX2.

In this case, the first multiplexer MUX1 that is included in the first detection unit 54 may select and output one of the input signal #CON and the first detection signal FZ_CON1 applied to the third pad PAD3, in response to the first operating state signal FREEZE_EN1.

In an embodiment, the first multiplexer MUX1 may select and output the first detection signal FZ_CON1 in the entry interval of the first freeze mode in which the first operating state signal FREEZE_EN1 stays activated, and may select and output the input signal #CON applied to the third pad PAD3, in the exit interval of the first freeze mode in which the first operating state signal FREEZE_EN1 stays deactivated.

Furthermore, the first flip-flop F/F1 that is included in the first detection unit 54 may output a signal from the first multiplexer MUX1 as the first detection signal FZ_CON1, in response to the input reference signal #WE among the input signals #CON applied to the third pad PAD3.

Specifically, the first flip-flop F/F1 may detect the input signal #CON applied to the third pad PAD3 each time the input reference signal #WE is applied, in the exit interval of the first freeze mode in which the first operating state signal FREEZE_EN1 stays deactivated, and may output the detected input signal #CON as the first detection signal FZ_CON1. Furthermore, the first operating state control unit 52 described with reference to FIG. 7 may switch the first operating state signal FREEZE_EN1 from a deactivation state to an activation state or from the activation state to the deactivation state in response to the input reference signal #WE among the input signals #CON. At this time, both the first operating state control unit 52 and the first flip-flop F/F1 may operate in response to the input reference signal #WE applied to the third pad PAD3, and may require a certain time until the first operating state control unit 52 performs an operating of switching the first operating state signal FREEZE_EN1 from the deactivation state to the activation state. Accordingly, the logic level of the first detection signal FZ_CON1 from the first flip-flop F/F1 at a time point when the first operating state signal FREEZE_EN1 switches from the deactivation state to the activation state may be the logic level of a signal from the first multiplexer MUX1, that is, the input signal #CON applied to the third pad PAD3, before the first operating state control unit 52 switches the first operating state signal FREEZE_EN1 from the deactivation state to the activation state.

Furthermore, the second multiplexer MUX2 that is included in the first signal transfer unit 55 may transfer, to the first internal operation execution unit 53, one of the input signal #CON and the first detection signal FZ_CON1 applied to the third pad PAD3.

In an embodiment, the second multiplexer MUX2 may select and output the first detection signal FZ_CON1 from the first flip-flop F/F1 in the entry interval of the first freeze mode in which the first operating state signal FREEZE_EN1 stays activated, may select the input signal #CON applied to the third pad PAD3 in the exit interval of the first freeze mode in which the first operating state signal FREEZE_EN1 stays deactivated, and may output the selected input signal #CON to the first internal operation execution unit 53.

Referring to FIG. 8B, a second detection unit 64 may include a third multiplexer MUX3 and a second flip-flop F/F2. Furthermore, the second signal transfer unit 65 may include a fourth multiplexer MUX4.

In this case, the third multiplexer MUX3 that is included in the second detection unit 64 may select and output one of the input signal #CON and the second detection signal FZ_CON2 applied to the fourth pad PAD4, in response to the second operating state signal FREEZE_EN2.

In an embodiment, the third multiplexer MUX3 may select and output the second detection signal FZ_CON2 in the entry interval of the second freeze mode in which the second operating state signal FREEZE_EN2 stays activated, and may select and output the input signal #CON applied to the fourth pad PAD4 in the exit interval of the second freeze mode in which the second operating state signal FREEZE_EN2 stays deactivated.

Furthermore, the second flip-flop F/F2 that is included in the second detection unit 64 may output a signal from the third multiplexer MUX3 as the second detection signal FZ_CON2, in response to the input reference signal #WE among the input signals #CON applied to the fourth pad PAD4.

Specifically, the second flip-flop F/F2 may detect the input signal #CON applied to the fourth pad PAD4 each time the input reference signal #WE is applied in the exit interval of the second freeze mode in which the second operating state signal FREEZE_EN2 stays deactivated, and may output the detected input signal #CON as the second detection signal FZ_CON2. Furthermore, the second operating state control unit 62 described with reference to FIG. 7 may switch the second operating state signal FREEZE_EN2 from a deactivation state to an activation state or from the activation state to the deactivation state in response to the input reference signal #WE among the input signals #CON. At this time, both the second operating state control unit 62 and the second flip-flop F/F2 may operate in response to the input reference signal #WE applied to the fourth pad PAD4, and may require a certain time until the second operating state control unit 62 performs an operation of the second operating state signal FREEZE_EN2 switching from the deactivation state to the activation state. Accordingly, the logic level of the second detection signal FZ_CON2 from the second flip-flop F/F2 at a time point when the second operating state signal FREEZE_EN2 switches from the deactivation state to the activation state may be the logic level of a signal from the third multiplexer MUX3, that is, the input signal #CON applied to the fourth pad PAD4, before the second operating state control unit 62 switches the second operating state signal FREEZE_EN2 from the deactivation state to the activation state.

Furthermore, the fourth multiplexer MUX4 that is included in the second signal transfer unit 65 may transfer, to the second internal operation execution unit 63, one of the input signal #CON and the second detection signal FZ_CON2 applied to the fourth pad PAD4.

In an embodiment, the fourth multiplexer MUX4 may select and output the second detection signal FZ_CON2 from the second flip-flop F/F2 in the entry interval of the second freeze mode in which the second operating state signal FREEZE_EN2 stays activated, may select the input signal #CON applied to the fourth pad PAD4 in the exit interval of the second freeze mode in which the second operating state signal FREEZE_EN2 stays deactivated, and may output the selected input signal #CON to the second internal operation execution unit 63.

Figure 9A:
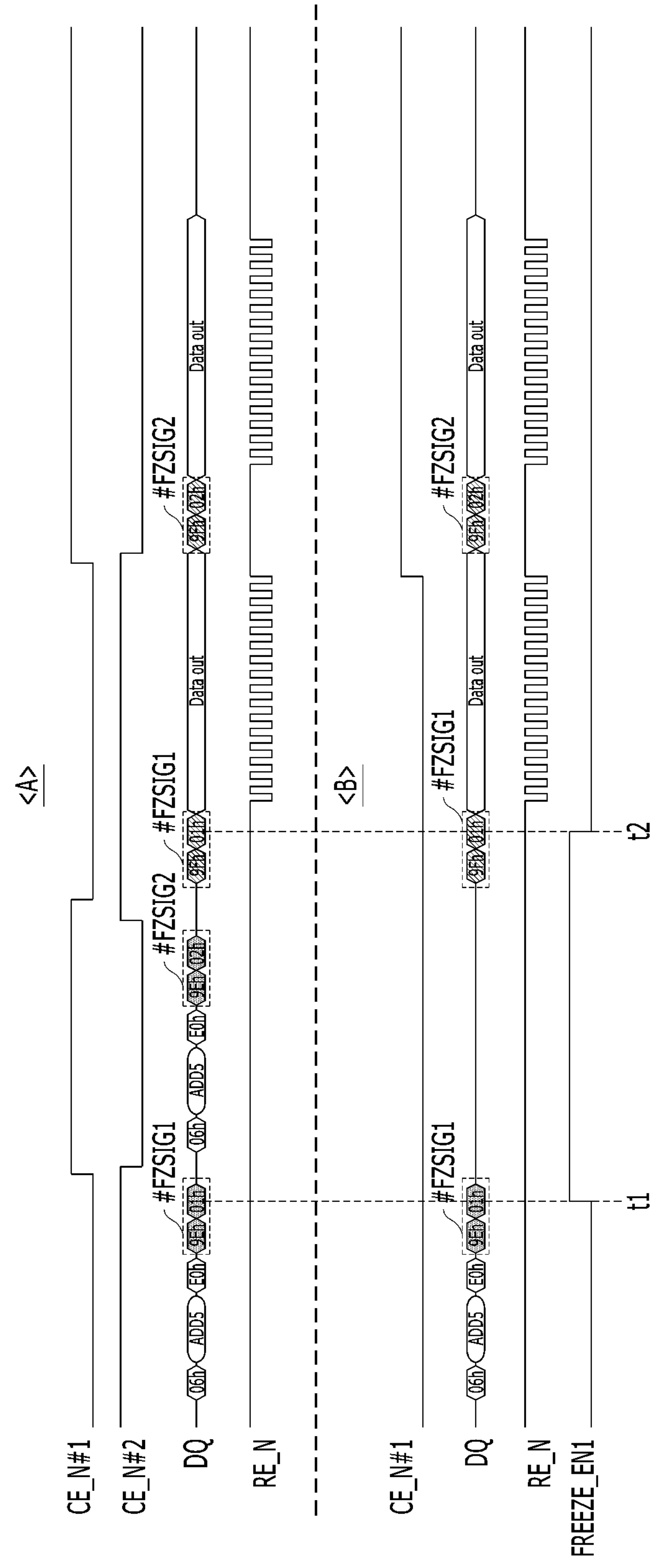
FIGS. 9A and 9B are timing diagrams for describing an operation of the memory device according to the second embodiment of the present disclosure, which is illustrated in FIG. 5.
Figure 9B:
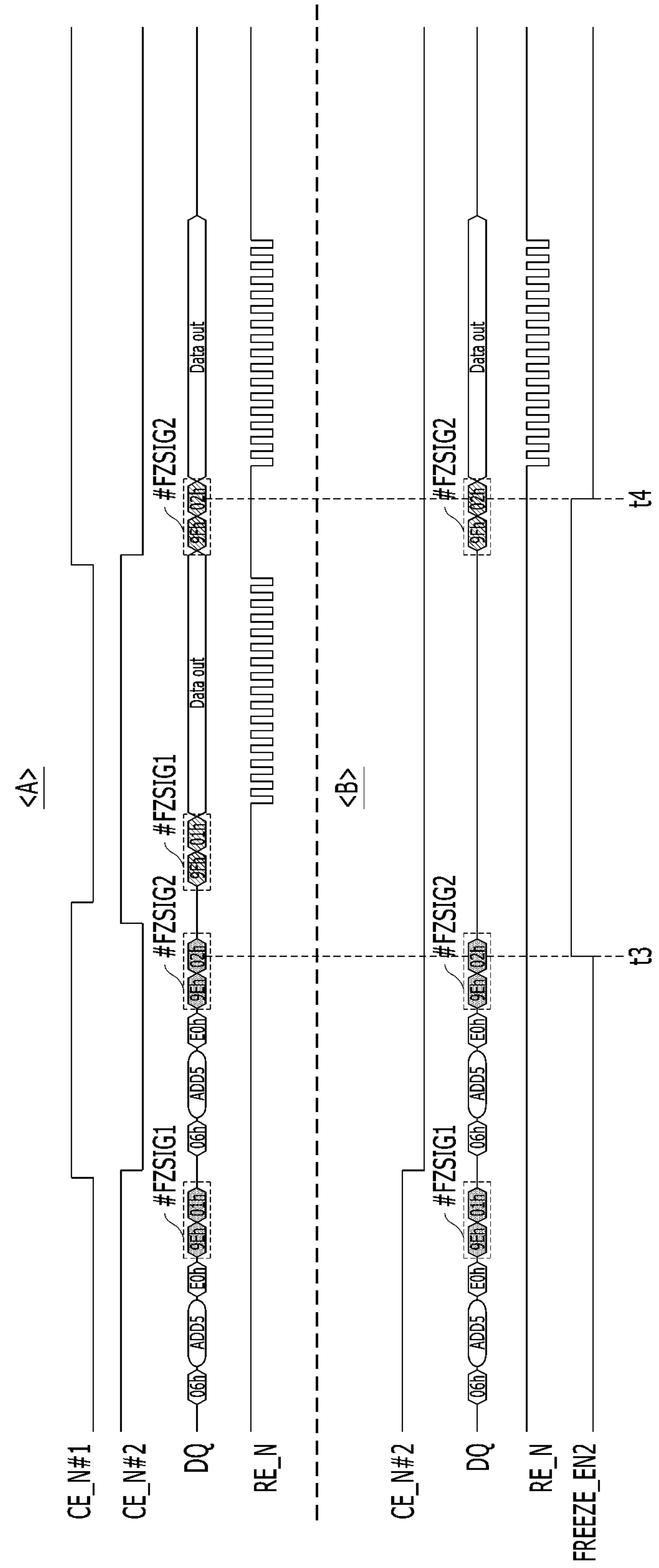

FIGS. 9A and 9B are timing diagrams for describing an operation of the memory device according to the second embodiment of the present disclosure, which is illustrated in FIG. 5.

First, it may be seen that FIGS. 9A and 9B are drawings in which the command #CMD and the control signal #CON that are generated by the controller 70 are transferred to the first memory die 50 and the second memory die 60 according to the second method described with reference to FIGS. 5 and 6B. That is, it may be seen that FIGS. 9A and 9B correspond to a method of the controller 70 dedicatedly using the first chip enable signal CE_N #1 in order to control whether to enable the first memory die 50 and dedicatedly using the second chip enable signal CE_N #2 in order to control whether to enable the second memory die 60.

Referring to FIG. 9A, it may be seen that how the first memory die 50 and the second memory die 60 that are included in the memory device 100 operate in the first freeze mode that the first memory die 50 that is included in the memory device 100 may enter.

Referring to FIG. 9B, it may be seen that how the first memory die 50 and the second memory die 60 that are included in the memory device 100 operate in the second freeze mode that the second memory die 60 that is included in the memory device 100 may enter.

Referring to FIGS. 9A and 9B along with FIGS. 5 and 6B, the data #DATA, the command #CMD, and the address #ADD may be transferred in common through the first to m-th I/O pads DQ1 to DQm that are included in each of the controller 70 and the first memory die 50 and second memory die 60 of the memory device 100. Accordingly, in FIGS. 9A and 9B, reference numeral "DQ" may mean signals #FZSIG1, #FZSIG2, 06*h*, ADD5, E0*h*, and Date out that are transferred to the first to m-th I/O pads DQ1 to DQm. That is, in FIGS. 9A and 9B, reference numeral "DQ" may mean a signal applied to the first pad PAD1 and second pad PAD2 of the first memory die 50 and the second memory die 60 that are included in the memory device 100 in common.

Furthermore, the control signal #CON may include the chip enable signal CE_N, the command latch enable signal CLE, the address latch enable signal ALE, the read enable signal RE_N, the write enable signal WE_N, and the data strobe signal DQS. Accordingly, in FIGS. 9A and 9B, reference numerals "CE_N #1, CE_N #2, and RE_N" may mean an operation of each of the first chip enable signal CE_N #1 and the read enable signal RE_N applied to the third pad PAD3 of the first memory die 50, and an operation of each of the second chip enable signal CE_N #2 and the read enable signal RE_N applied to the fourth pad PAD4 of the second memory die 60.

Referring to both <A> of FIG. 9A and <A> of FIG. 9B, the $1^{st}$ first freeze signal #FZSIG1 may be loaded onto the first line LINE1 to which the first pad PAD1 of the first memory die 50 and the second pad PAD2 of the second memory die 60, which are included in the memory device 100, are connected by sharing the first line LINE1. Thereafter, the $1^{st}$ second freeze signal #FZSIG2 may be loaded onto the first line LINE1. Thereafter, the $2^{nd}$ first freeze signal #FZSIG1 may be loaded onto the first line LINE1. Thereafter, the $2^{nd}$ second freeze signal #FZSIG2 may be loaded onto the first line LINE1.

Furthermore, another signal 06*h*, ADD5, and E0*h* may be loaded onto the first line LINE1 before the $1^{st}$ first freeze signal #FZSIG1 is loaded onto the first line LINE1. At this time, the another signal 06*h*, ADD5, and E0*h* and the $1^{st}$ first freeze signal #FZSIG1 previously loaded onto the first line LINE1 before the $1^{st}$ first freeze signal #FZSIG1 is loaded onto the first line LINE1 are signals loaded onto the first line LINE1 in the state in which the first chip enable signal CE_N #1 stays activated to a logic low level and the second chip enable signal CE_N #2 stays deactivated to a logic high level. Accordingly, the another signal 06*h*, ADD5, and E0*h* and the $1^{st}$ first freeze signal #FZSIG1 may be applied to the first pad PAD1 of the first memory die 50, and may be input to the first internal operation execution unit 53. Furthermore, since the first chip enable signal CE_N #1 has the state in which the first chip enable signal CE_N #1 stays activated, each of the $1^{st}$ first chip enable signal CE_N #1 and the read enable signal RE_N illustrated in this drawing among the control signals #CON, and other signals CLE, ALE, and WE_N that have not been illustrated in this drawing among the control signals #CON, may be applied to the third pad PAD3 of the first memory die 50 through the second line LINE2, and may be input to the first internal operation execution unit 53.

Furthermore, the another signal 06*h*, ADD5, and E0*h* may be loaded onto the first line LINE1 before the $1^{st}$ second freeze signal #FZSIG2 is loaded onto the first line LINE1. At this time, the another signal 06*h*, ADD5, and E0*h* and the $1^{st}$ second freeze signal #FZSIG2 loaded onto the first line LINE1 before the $1^{st}$ second freeze signal #FZSIG2 is loaded onto the first line LINE1 are signals loaded onto the first line LINE1 in the state in which the second chip enable signal CE_N #2 stays activated to a logic low level and the first chip enable signal CE_N #1 stays deactivated to a logic high level. Accordingly, the another signal 06*h*, ADD5, and E0*h* and the $1^{st}$ second freeze signal #FZSIG2 may be applied to the second pad PAD2 of the second memory die 60, and may be input to the second internal operation execution unit 63. Furthermore, since the second chip enable signal CE_N #2 has the state in which the second chip enable signal CE_N #2 stays activated, the $1^{st}$ second chip enable signal CE_N #2 and the read enable signal RE_N illustrated in this drawing among the control signals #CON, and the other signals CLE, ALE, and WE_N that have not been illustrated in this drawing among the control signals #CON, may be applied to the fourth pad PAD4 of the second memory die 60 through the second line LINE2 and the third line LINE3, respectively, and may be input to the second internal operation execution unit 63.

Furthermore, after the $2^{nd}$ first freeze signal #FZSIG1 is loaded onto the first line LINE1, data may be loaded onto the first line LINE1 (Data out). At this time, the data and the $2^{nd}$ first freeze signal #FZSIG1 loaded onto the first line LINE1 are signals loaded onto the first line LINE1 in the state in which the first chip enable signal CE_N #1 stays activated to a logic low level and the second chip enable signal CE_N #2 stays deactivated to a logic high level. Accordingly, it may be seen that the data and the $2^{nd}$ first freeze signal #FZSIG1 are signals output from the first pad PAD1 of the first memory die 50 to the first line LINE1. Furthermore, since the first chip enable signal CE_N #1 has the state in which the first chip enable signal CE_N #1 stays activated, each of the $2^{nd}$ first chip enable signal CE_N #1 and the read enable signal RE_N illustrated in this drawing among the control signals #CON, and the other signals CLE, ALE, and WE_N that have not been illustrated in this drawing among the control signals #CON, may be applied to the third pad PAD3 of the first memory die 50 through the second line LINE2, and may be input to the first internal operation execution unit 53.

Furthermore, after the $2^{nd}$ second freeze signal #FZSIG2 is loaded onto the first line LINE1, data may be loaded onto the first line LINE1 (Data out). At this time, the data and the $2^{nd}$ second freeze signal #FZSIG2 loaded onto the first line LINE1 are signals loaded onto the first line LINE1 in the state in which the second chip enable signal CE_N #2 stays activated to a logic low level and the first chip enable signal CE_N #1 stays deactivated to a logic high level. Accordingly, it may be seen that the data and the $2^{nd}$ second freeze signal #FZSIG2 are signals output from the second pad PAD2 of the second memory die 60 to the first line LINE1. Furthermore, since the second chip enable signal CE_N #2 has the state in which the second chip enable signal CE_N #2 stays activated, the $2^{nd}$ second chip enable signal CE_N #2 and the read enable signal RE_N illustrated in this drawing among the control signals #CON, and the other signals CLE, ALE, and WE_N that have not been illustrated in this drawing among the control signals #CON, may be applied to the fourth pad PAD4 of the second memory die 60 through the second line LINE2 and the third line LINE3, respectively, and may be input to the second internal operation execution unit 63.

An operation of the first memory die 50 is described with reference to <B> of FIG. 9A from a viewpoint of the first memory die 50. After the 1st first freeze signal #FZSIG1 is applied to the first pad PAD1 through the first line LINE1, in an interval until the 2nd first freeze signal #FZSIG1 is applied, the first memory die 50 may receive, through the first pad PAD1, signals 06*h*, ADD5, E0*h*, and #FZSIG2 loaded onto the first line LINE1, and may receive, through the third pad PAD3, the control signal #CON loaded onto the second line LINE2.

Specifically, the first memory die 50 may enter the first freeze mode by activating the first operating state signal FREEZE_EN1 to a logic high level, in response to the 1st first freeze signal #FZSIG1 applied to the first pad PAD1. That is, since the first operating state signal FREEZE_EN1 stays deactivated to a logic low level and the first memory die 50 has exited from the first freeze mode before the 1st first freeze signal #FZSIG1 is applied to the first pad PAD1, the first memory die 50 may enter the first freeze mode by activating the first operating state signal FREEZE_EN1 to a logic high level, in response to the 1st first freeze signal #FZSIG1 applied to the first pad PAD1.

Furthermore, the first memory die 50 may exit from the first freeze mode by deactivating the first operating state signal FREEZE_EN1 to a logic low level, in response to the 2nd first freeze signal #FZSIG1 applied to the first pad PAD1. That is, since the first operating state signal FREEZE_EN1 stays activated to a logic high level and the first memory die 50 has entered the first freeze mode before the 2nd first freeze signal #FZSIG1 is applied to the first pad PAD1, the first memory die 50 may exit from the "first freeze mode by deactivating the first operating state signal FREEZE_EN1 to a logic low level", in response to the 2nd first freeze signal #FZSIG1 applied to the first pad PAD1.

Furthermore, the first memory die 50 may detect, in response to the 1st first freeze signal #FZSIG1 applied to the first pad PAD1, the logic level of the control signal #CON applied to the third pad PAD3 at a time point when the first operating state signal FREEZE_EN1 switches from a logic low level to a logic high level, and may transfer, to the first internal operation execution unit 53, the signal IN_CON having the detected logic level of the control signal #CON1. At this time, the signal IN_CON having the detected logic level of the control signal #CON1 may maintain, in response to the 2nd first freeze signal #FZSIG1 applied to the first pad PAD1, the logic level of the signal IN_CON until the time point when the first operating state signal FREEZE_EN1 switches from a logic high level to a logic low level, that is, in the entry interval of the first freeze mode in which the logic level of the first operating state signal FREEZE_EN1 stays at a logic high level.

In an embodiment, the first memory die 50 may transfer, to the first internal operation execution unit 53 while the logic level of the first chip enable signal CE_N #1 stays at a logic low level in the entry interval of the first freeze mode, the first chip enable signal CE_N #1 having a logic level detected as a logic low level at a time point of entering the first freeze mode.

Even after the first freeze signal #FZSIG1 was applied to the first pad PAD1 and the first memory die 50 entered the first freeze mode, the signals 06*h*, ADD5, E0*h*, and #FZSIG2 loaded onto the first line LINE1 may be applied to the first pad PAD1, and the control signal #CON loaded onto the second line LINE2 may be applied to the third pad PAD3.

However, the first memory die 50 in the first freeze mode may ignore all of the signals 06*h*, ADD5, E0*h*, and #FZSIG2 loaded onto the first line LINE1 and applied to the first pad PAD1 and the control signal #CON loaded onto the second line LINE2 and applied to the third pad PAD3 by blocking all of the signals 06*h*, ADD5, E0*h*, and #FZSIG2 and the control signal #CON. That is, the first memory die 50 may not transfer, to the first internal operation execution unit 53, the signals 06*h*, ADD5, E0*h*, and #FZSIG2 loaded onto the first line LINE1 in the entry interval of the first freeze mode. Furthermore, the first memory die 50 may transfer, to the first internal operation execution unit 53 in the entry interval of the first freeze mode, the signal IN_CON having a logic level of the control signal #CON1, which has been detected at the time point of entering the first freeze mode.

Accordingly, after the first memory die 50 enters the first freeze mode, any signal cannot affect an operation within the first memory die 50 although the signal is applied to the first line LINE1 connected to the first pad PAD1 and the second line LINE2 connected to the third pad PAD3.

Furthermore, an operation of the second memory die 60 is described with reference to <B> of FIG. 9B from a viewpoint of the second memory die 60. The second memory die 60 may receive the signals 06*h*, ADD5, E0*h*, and #FZSIG2 loaded onto the first line LINE1 through the second pad PAD2 and may receive the control signal #CON loaded onto the second line LINE2 through the fourth pad PAD4, in an interval until the 2nd second freeze signal #FZSIG2 is applied to the second pad PAD2 after the 1st second freeze signal #FZSIG2 is applied through the first line LINE1.

Specifically, the second memory die 60 may enter the second freeze mode by activating the second operating state signal FREEZE_EN2 to a logic high level, in response to the 1st second freeze signal #FZSIG2 applied to the second pad PAD2. That is, since the second operating state signal FREEZE_EN2 stays deactivated to a logic low level and the second memory die 60 has exited from the second freeze mode before the 1st second freeze signal #FZSIG2 is applied to the second pad PAD2, the second memory die 60 may enter the second freeze mode by activating the second operating state signal FREEZE_EN2 to a logic high level, in response to the 1st second freeze signal #FZSIG2 applied to the second pad PAD2.

Furthermore, the second memory die 60 may exit from the second freeze mode by deactivating the second operating state signal FREEZE_EN2 to a logic low level, in response to the 2nd second freeze signal #FZSIG2 applied to the second pad PAD2. That is, since the second operating state signal FREEZE_EN2 stays activated to a logic high level and the second memory die 60 has entered the second freeze mode before the 2nd second freeze signal #FZSIG2 is applied to the second pad PAD2, the second memory die 60 may exit from the second freeze mode by deactivating the second operating state signal FREEZE_EN2 to a logic low level, in response to the 2nd second freeze signal #FZSIG2 applied to the second pad PAD2.

Furthermore, the second memory die 60 may detect, in response to the 1st second freeze signal #FZSIG2 applied to the second pad PAD2, the logic level of the control signal #CON applied to the fourth pad PAD4 at a time point when the second operating state signal FREEZE_EN2 switches from a logic low level to a logic high level, and may transfer, to the second internal operation execution unit 63, the signal IN_CON having the detected logic level of the control signal #CON2. At this time, the signal IN_CON having the detected logic level of the control signal #CON2 may maintain, in response to the $2^{nd}$ second freeze signal #FZSIG2 applied to the second pad PAD2, the logic level of the signal IN_CON until the time point when the second operating state signal FREEZE_EN2 switches from a logic high level to a logic low level, that is, in the entry interval of the second freeze mode in which the logic level of the second operating state signal FREEZE_EN2 stays at a logic high level.

In an embodiment, the second memory die 60 may transfer, to the second internal operation execution unit 63 while the logic level of the second chip enable signal CE_N #2 stays at a logic low level in the entry interval of the second freeze mode, the second chip enable signal CE_N #2 having a logic low level detected at a time point of entering the second freeze mode.

In an embodiment, the second memory die 60 may transfer, to the second internal operation execution unit 63 while the logic level of the read enable signal RE_N stays at a logic high level in the entry interval of the second freeze mode, the read enable signal RE_N having a logic high level detected at the time point of entering the second freeze mode.

Even after the second freeze signal #FZSIG2 was applied to the second pad PAD2 and the second memory die 60 entered the second freeze mode, the signals #FZSIG1 and Data out loaded onto the first line LINE1 may be applied to the second pad PAD2, and the control signal #CON loaded onto the second line LINE2 may be applied to the fourth pad PAD4.

However, the second memory die 60 in the second freeze mode may ignore all of the signals #FZSIG1 and Data out loaded onto the first line LINE1 and applied to the second pad PAD2 and the control signal #CON loaded onto the second line LINE2 and applied to the fourth pad PAD4 by blocking all of the signals #FZSIG1 and Data out and the control signal #CON. That is, the second memory die 60 may not transfer, to the second internal operation execution unit 63, the signals #FZSIG1 and Data out loaded onto the first line LINE1 in the entry interval of the second freeze mode. Furthermore, the second memory die 60 may transfer, to the second internal operation execution unit 63 in the entry interval of the second freeze mode, the signal IN_CON having a logic level of the control signal #CON2, which has been detected at a time point of entering the second freeze mode.

Accordingly, after the second memory die 60 enters the second freeze mode, any signal cannot affect an operation within the second memory die 60 although the signal is applied to the first line LINE1 connected to the second pad PAD2 and the second line LINE2 connected to the fourth pad PAD4.

The present disclosure described above is not limited to the aforementioned embodiments and the accompanying drawings. It is evident to a person having ordinary knowledge in the art to which the present disclosure pertains that the present disclosure may be substituted, modified, and changed in various ways without departing from the technical spirit of the present disclosure and the following claims. Furthermore, the embodiments may be combined to form additional embodiments.

What is claimed is:

1. A memory device comprising:

a command decoder configured to generate a command by decoding a first input signal applied to a first pad, wherein whether the command decoder is to be disabled is selected based on whether an operating state signal is activated;

an operating state controller configured to switch an operating state of memory dies, within the memory device sharing the command over a common channel from the command decoder, from an activation state to a deactivation state and thereafter from the deactivation state to the activation state, in response to a set signal applied to the first pad; and an internal operation execution circuit configured to perform a set internal operation in response to the command, wherein the command decoder is disabled while an operating state signal associated with the operating state of the memory device stays activated.

2. The memory device of claim 1, wherein the set signal is a freeze signal of entering a freeze mode that blocks the first input signal applied to the first pad in an entry interval of the freeze mode, and the memory device, in response to the freeze signal, enters the deactivation state.

3. The memory device of claim 2, wherein the operating state controller is configured to keep an activated operating state signal activated and keep a deactivated operating state signal deactivated in response to remaining signals except for the set signal.

4. The memory device of claim 3, further comprising:

a detection circuit configured to detect a logic level of a second input signal applied to a second pad at a time point when the operating state signal becomes activated; and a signal transfer circuit configured to:

transfer, to the internal operation execution circuit while the deactivated operating state signal stays deactivated, the second input signal applied to the second pad, and transfer, to the internal operation execution circuit while the activated operating state signal stays activated, a signal having the logic level detected by the detection circuit.

5. The memory device of claim 4, wherein the detection circuit comprises:

a first multiplexer configured to select and output, in response to the operating state signal, one of the second input signal applied to the second pad and a detection signal; and a flip-flop configured to output, as the detection signal, the signal from the first multiplexer in response to an input reference signal among input signals applied to the second pad.

6. The memory device of claim 4, wherein the signal transfer circuit comprises a second multiplexer configured to transfer, to the internal operation execution circuit and in response to the operating state signal, one of the second input signal applied to the second pad and the signal having the logic level detected by the detection circuit.

7. The memory device of claim 4, wherein:

the command decoder is further configured to receive, in response to an input reference signal among input signals including the second input signal applied to the second pad and the first input signal applied to the first pad, and the operating state controller is further configured to receive, in response to the input reference signal applied to the second pad, the set signal applied to the first pad.

8. A memory device comprising:

a first die including a first pad connected to a first line and configured to:

block, during a first set mode, signals except a first set signal for controlling the first die to exit from the first set mode, and perform, during a mode other than the first set mode, a first set internal operation in response to a first input signal applied to the first pad; and a second die including a second pad connected to the first line comprising a common channel sharing commands with the first die and the second die and configured to:

block, during the second set mode, signals except a second set signal for controlling the second die to exit from the second set mode, and perform, during a mode other than the second set mode, a second set internal operation in response to a second input signal applied to the second pad, wherein the memory device is configured to switch the first die and the second die from a perform state to a block state and thereafter from the block state to the perform state, in response respectively to the first input signal applied to the first pad and the second input signal applied to the second pad, wherein command decoding is disabled while an operating state signal associated with an operating state of the memory device stays activated.

9. The memory device of claim 8, wherein:

the first die is further configured to enter or exit from the first set mode in response to the first set signal applied to the first pad, and the second die is further configured to enter or exit from the second set mode in response to the second set signal applied to the second pad.

10. The memory device of claim 9, wherein the first die comprises:

a first command decoder enabled during the mode other than the first set mode and disabled during the first set mode and configured to generate a first command of the commands by decoding the first input signal applied to the first pad;

a first operating state controller configured to activate or deactivate a first operating state signal in response to the first set signal applied to the first pad; and a first internal operation execution circuit configured to perform the first internal operation in response to the first command, and wherein the first operating state signal stays activated during the first set mode and stays deactivated during the mode other than the first set mode.

11. The memory device of claim 10, wherein the second die comprises:

a second command decoder enabled during the mode other than the second set mode and disabled during the second set mode and configured to generate a second command of the commands by decoding the second input signal applied to the second pad;

a second operating state controller configured to activate or deactivate a second operating state signal in response to the second set signal applied to the second pad; and a second internal operation execution circuit configured to perform the second internal operation in response to the second command, and wherein the second operating state signal stays activated during the second set mode and stays deactivated during the mode other than the second set mode.

12. The memory device of claim 11, wherein:

the first operating state controller is configured to keep an activated first operating state signal activated and keep a deactivated first operating state signal deactivated in response to the first set signal among input signals applied to the first pad, and the second operating state controller is configured to keep an activated second operating state signal activated and keep a deactivated second operating state signal deactivated in response to the second set signal among input signals applied to the second pad.

13. The memory device of claim 12, wherein the first die further comprises:

a third pad connected to a second line;

a first detection circuit configured to detect a logic level of a third input signal applied to the third pad at a time point when the first operating state signal becomes activated; and a first signal transfer circuit configured to:

transfer, to the first internal operation execution circuit while the deactivated first operating state signal stays deactivated, the third input signal applied to the third pad, and transfer, to the first internal operation execution circuit while the activated first operating state signal stays activated, a signal having the logic level detected by the first detection circuit.

14. The memory device of claim 13, wherein the second die further comprises:

a fourth pad connected to the second line or the third line;

a second detection circuit configured to detect a logic level of a fourth input signal applied to the fourth pad at a time point when the second operating state signal becomes activated; and a second signal transfer circuit configured to:

transfer, to the second internal operation execution circuit while the deactivated second operating state signal stays deactivated, the fourth input signal applied to the fourth pad, and transfer, to the second internal operation execution circuit while the activated second operating state signal stays activated, a signal having the logic level detected by the second detection circuit.

15. The memory device of claim 14, wherein the first detection circuit comprises:

a first multiplexer configured to select and output, in response to the first operating state signal, one of the third input signal applied to the third pad and a first detection signal; and a first flip-flop configured to output, as the first detection signal, the signal from the first multiplexer in response to an input reference signal among input signals applied to the third pad.

16. The memory device of claim 14, wherein the first signal transfer circuit comprises a second multiplexer configured to transfer, to the internal operation execution circuit and in response to the first operating state signal, one of the third input signal applied to the third pad and the signal having the logic level detected by the first detection circuit.

17. The memory device of claim 14, wherein the second detection circuit comprises:

a third multiplexer configured to select and output, in response to the second operating state signal, one of the fourth input signal applied to the fourth pad and a second detection signal; and a second flip-flop configured to output, as the second detection signal, the signal from the third multiplexer in response to the input reference signal among input signals applied to the fourth pad.

18. The memory device of claim 14, wherein the second signal transfer circuit comprises a fourth multiplexer configured to transfer, to the internal operation execution circuit and in response to the second operating state signal, one of the fourth input signal applied to the fourth pad and the signal having the logic level detected by the second detection circuit.

19. The memory device of claim 14, wherein:

the first command decoder is further configured to receive the first input signal applied to the first pad in response to an input reference signal among input signals applied to the third pad, the first operating state controller is further configured to receive, in response to the input reference signal applied to the third pad, the first set signal applied to the first pad, the second command decoder is further configured to receive the second input signal applied to the second pad in response to the input reference signal among input signals applied to the fourth pad, and the second operating state controller is further configured to receive, in response to the input reference signal applied to the fourth pad, the second set signal applied to the second pad.

* * * * *